(12) United States Patent
Morinaga et al.

(10) Patent No.: US 11,520,199 B2
(45) Date of Patent: Dec. 6, 2022

(54) DISPLAY DEVICE

(71) Applicant: SHARP KABUSHIKI KAISHA, Sakai (JP)

(72) Inventors: Junichi Morinaga, Sakai (JP); Masahiro Yoshida, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/223,637

(22) Filed: Apr. 6, 2021

(65) Prior Publication Data

US 2021/0318582 A1 Oct. 14, 2021

(30) Foreign Application Priority Data

Apr. 8, 2020 (JP) .............................. JP2020-069721

(51) Int. Cl.
*G09G 3/36* (2006.01)
*G02F 1/1362* (2006.01)
(Continued)

(52) U.S. Cl.
CPC ...... *G02F 1/136213* (2013.01); *G02F 1/1368* (2013.01); *G02F 1/13306* (2013.01); *G02F 1/133345* (2013.01); *G02F 1/136218* (2021.01); *G02F 1/136286* (2013.01); *G09G 3/342* (2013.01); *G09G 3/3413* (2013.01); *G09G 3/3607* (2013.01); *G09G 3/3648* (2013.01); *H01L 27/124* (2013.01); *H01L 27/1225* (2013.01); *H01L 27/1255* (2013.01); *H01L 29/7869* (2013.01); *G02F 2203/30* (2013.01); *G09G 2300/0426* (2013.01);
(Continued)

(58) Field of Classification Search
CPC ........... G02F 1/13306; G02F 1/133345; G02F 1/136213; G02F 1/136218; G02F 1/136286; G02F 1/1368; G02F 2203/30; G02F 1/1343; G09G 2300/0426; G09G 2300/0876; G09G 2310/0235; G09G 2320/0223; G09G 3/3648; G09G 2300/043; H01L 27/124; H01L 27/1255; H01L 27/3265; H01L 27/3272; H01L 29/78633
See application file for complete search history.

(56) References Cited

U.S. PATENT DOCUMENTS 8,350,795 B2 * 1/2013 Kim .................. G02F 1/136286
345/204
2011/0012815 A1 * 1/2011 Tsubata ............. G02F 1/136213
345/55
(Continued)

FOREIGN PATENT DOCUMENTS

WO 2010/137230 A1 12/2010

*Primary Examiner* — Duc Q Dinh
(74) *Attorney, Agent, or Firm* — ScienBiziP, P.C.

(57) ABSTRACT

A display device includes: a capacitance wire; a first pixel electrode disposed so as to be adjacent to the capacitance wire; a second pixel electrode disposed so that the capacitance wire is located between the first pixel electrode and the second pixel electrode; a first capacitance forming electrode connected to the first pixel electrode and disposed so as to overlap the capacitance wire via an insulating film; and a shield electrode disposed so as to be located between the first pixel electrode and the second pixel electrode and so as to at least partially overlap the first capacitance forming electrode via an insulating film.

16 Claims, 26 Drawing Sheets

(51) Int. Cl.
*G02F 1/1333* (2006.01)
*G02F 1/1368* (2006.01)
*G02F 1/133* (2006.01)
*H01L 27/12* (2006.01)
*H01L 29/786* (2006.01)
*G09G 3/34* (2006.01)

(52) U.S. Cl.
CPC ............... *G09G 2300/0876* (2013.01); *G09G 2310/0237* (2013.01); *G09G 2310/0248* (2013.01)

(56) References Cited

U.S. PATENT DOCUMENTS

| | | | | |
|---|---|---|---|---|
| 2011/0058110 A1* | 3/2011 | Yamada | ............ | G02F 1/136213 348/790 |
| 2012/0068916 A1* | 3/2012 | Tsubata | ................ | G02F 1/1362 345/94 |

\* cited by examiner

DISPLAY DEVICE

CROSS-REFERENCE TO RELATED APPLICATIONS

This application claims the benefit of priority to Japanese Patent Application Number 2020-069721 filed on Apr. 8, 2020. The entire contents of the above-identified application are hereby incorporated by reference.

BACKGROUND

1. Field

The technology disclosed herein relates to a display device.

2. Description of the Related Art

Heretofore, an active matrix substrate disclosed in International Publication No. 2010/137230 (which is hereinafter referred to as "Patent Document 1") has been known as one example of active matrix substrates used in liquid-crystal display devices. In Patent Document 1, in an active matrix substrate used in a liquid-crystal display device in which two scan signal lines are simultaneously scanned, pixel regions, each including two pixel electrodes, are arranged in a row direction and a column direction, which is a scan direction, and one scan signal line is provided corresponding to one row of the pixel regions; and an electrical conductor for shielding is disposed so as overlap a gap between two adjacent pixel electrodes, one of which is included in an arbitrary one of the pixel regions, and the other pixel electrode is included in the pixel region that is adjacent to the arbitrary pixel electrode downstream in the scan direction.

According to the active matrix substrate disclosed in Patent Document 1, it is possible to enhance the display quality of a liquid-crystal display device in which two scan signal lines are simultaneously selected. However, the electrical conductor for shielding is disposed so as to also overlap a gap between two capacitance electrodes respectively connected to two adjacent pixel electrodes. In such an arrangement, the area where a storage capacitance wire and the capacitance electrodes overlap each other is reduced by an amount by which the electrical conductor for shielding overlaps the storage capacitance wire, and thus there is a possibility that a storage capacitance is not sufficiently ensured. Moreover, the above-described arrangement has a possibility of being unable to sufficiently obtain an effect of allowing the electrical conductor for shielding to shield an electric field that can occur between one pixel electrode of two adjacent pixel electrodes and the capacitance electrode connected to the other pixel electrode. As a result, potentials of the pixel electrodes become more likely to vary, and thus there is a possibility that the display quality declines. In particular, there is a possibility that the display quality declines considerably when the charging time of the pixel electrodes decreases.

Thus, it is desirable to suppress a decline in display quality.

SUMMARY

A display device according to a technology disclosed herein includes: at least one capacitance wire; at least one first pixel electrode disposed so as to be adjacent to the capacitance wire; at least one second pixel electrode disposed so that the capacitance wire is located between the first electrode and the second pixel electrode; a first capacitance forming electrode connected to the first pixel electrode and disposed so as to overlap the capacitance wire via an insulating film; and a shield electrode disposed so as to be located between the first pixel electrode and the second pixel electrode and so as to at least partially overlap the first capacitance forming electrode via an insulating film.

DESCRIPTION OF THE EMBODIMENTS

First Embodiment

A first embodiment will be described with reference to FIGS. 1 to 15. In the present embodiment, a liquid-crystal display device (a display device) 10 be described by way of example. In some of the drawings, an X-axis, a Y-axis, and a Z-axis are depicted so that the axial directions thereof correspond to directions indicated in the corresponding drawings. With respect to up-and-down directions, an upper side may be referred to as an obverse side, and a lower side may be referred to as a reverse side, based on FIGS. 1, 9, 11, and 13 to 15.

Figure 1:
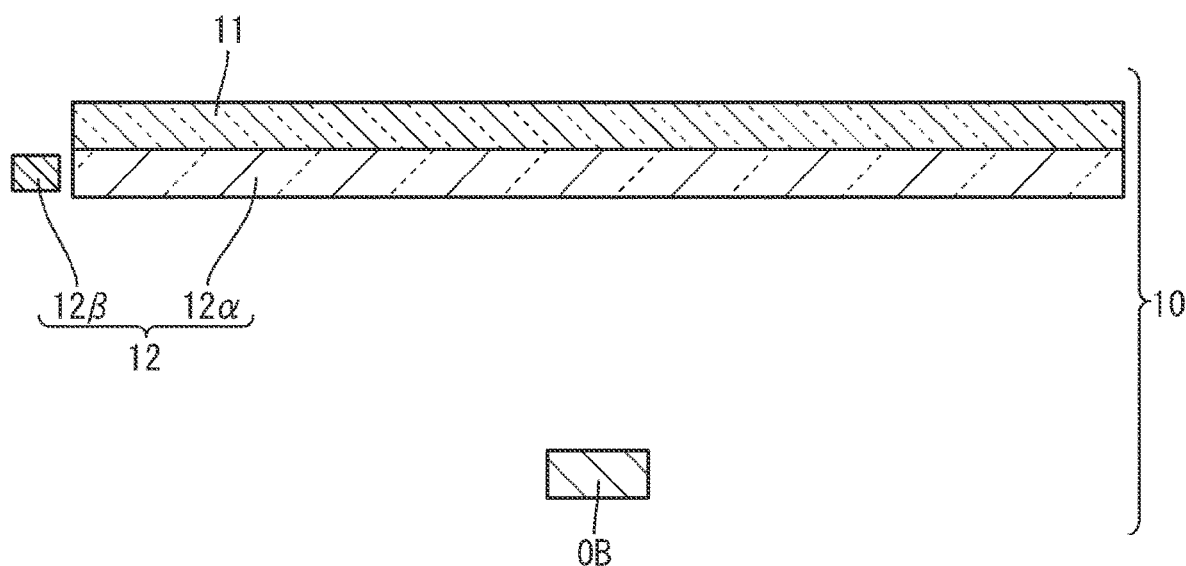
FIG. 1 is a side view of a liquid-crystal display device according to a first embodiment and an object.

FIG. 1 is a side view of the liquid-crystal display device 10 and an object OB. As illustrated in FIG. 1, the liquid-crystal display device 10 includes at least a liquid-crystal panel 11 that can display an image and a backlight device 12 that is an external light source for illuminating the liquid-crystal panel 11 with light for use in display. The backlight device 12 includes a light guide plate 12α disposed so as to face the reverse side of the liquid-crystal panel 11 and a light source 12β arranged at at least one side surface of the light guide plate 12α. In the present embodiment, the liquid-crystal panel 11 and the light guide plate 12α are both see-through types that allow light to pass therethrough, so that a user can view the object OB, present at an opposite side of (a reverse side of) the liquid-crystal panel 11 with respect to the backlight device 12, through the liquid-crystal panel 11 and the backlight device 12. In this case, when the liquid-crystal panel 11 is adapted to display an image, it is possible to allow the user to view the object OB and the image that are superimposed on each other. An illumination light source for illuminating the object OB with illumination light can also be installed independently from the backlight device 12. The liquid-crystal display device 10 according to the present embodiment can also be used for game machines and so on.

Figure 2:
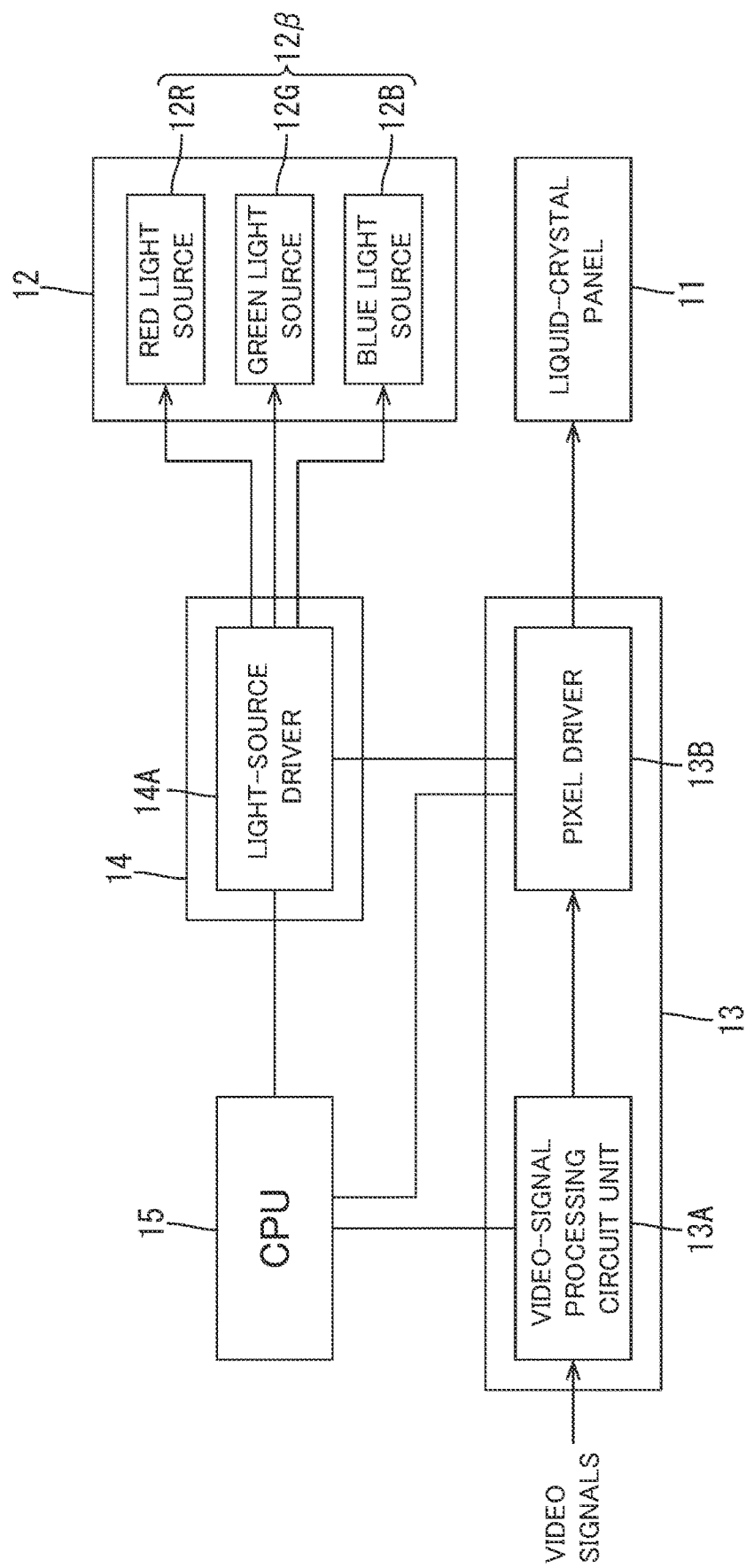
FIG. 2 is a block diagram regarding control of a liquid-crystal panel and a backlight device included in the liquid-crystal display device.

The liquid-crystal display device 10 employs a field sequential system that realizes color display by performing display through temporally sequentially switching of a red image, a green image, and a blue image. FIG. 2 is a block diagram regarding control on the liquid-crystal panel 11 and the backlight device 12 included in the liquid-crystal display device 10. Specifically, as illustrated in FIG. 2, the liquid-crystal display device 10 includes: the liquid-crystal panel 11, which does not have a color filter; the backlight device 12 having the light source 12β, which includes a red light source 12R, a green light source 12G, and a blue light source 12B; a panel controller 13 that controls the liquid-crystal panel 11; and a backlight controller (a lighting controller) 14 that controls the backlight device 12. The red light source 12R included in the backlight device 12 is adapted to emit light in a red wavelength range (about 600 nm to about 780 nm), that is, to emit only red light. Similarly, the green light source 12G is adapted to emit light in a green wavelength range (about 500 nm to about 570 nm), that is, to emit only green light. The blue light source 12B is adapted to emit light in a blue wavelength range (about 420 nm to about 500 nm), that is, to emit only blue light. For example, light-emitting diodes (LEDs), laser light sources, or organic electro luminescence (EL) devices are used as the red light source 12R, the green light source 12G, and the blue light source 12B.

Figure 3:
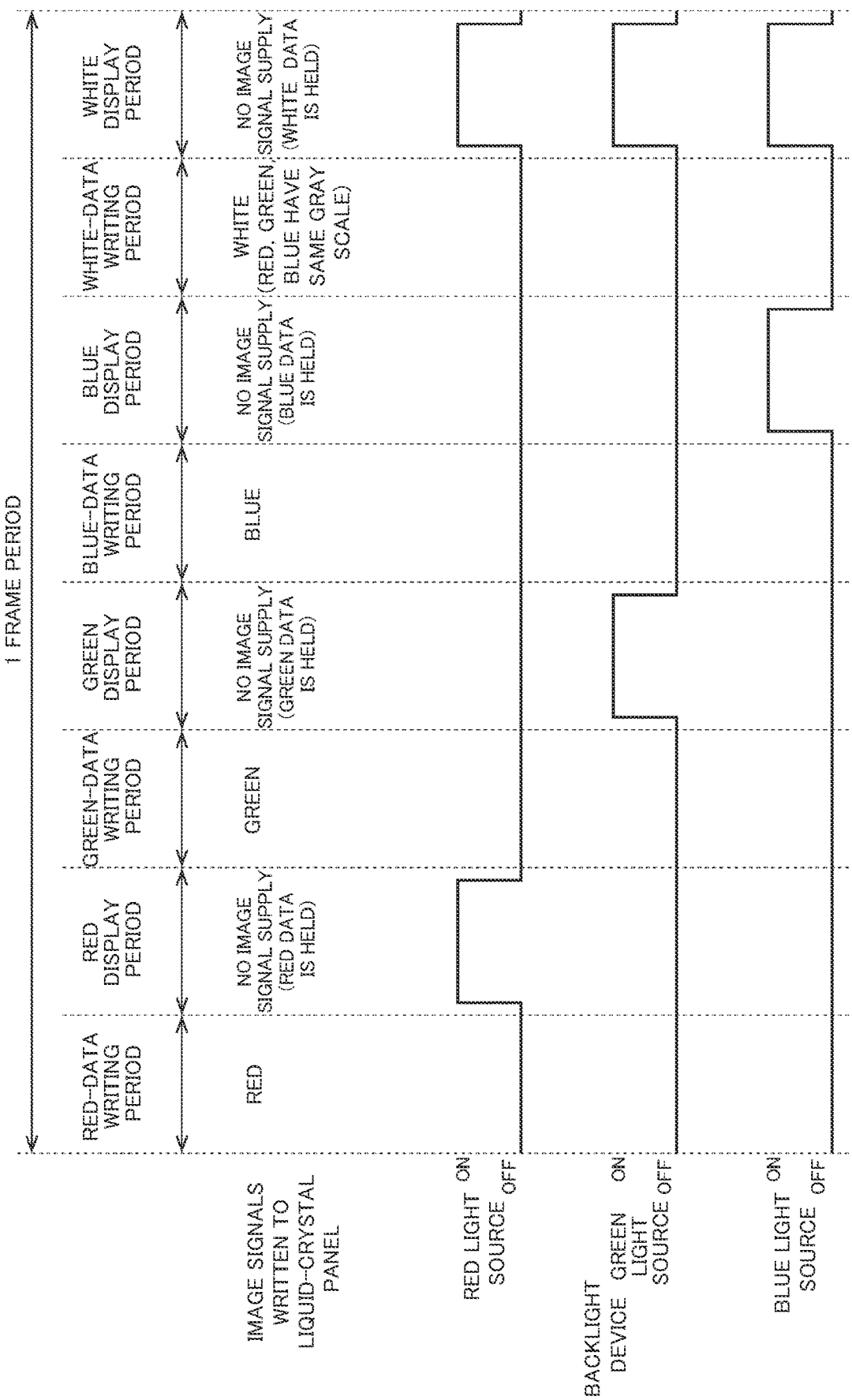
FIG. 3 is a chart illustrating timings regarding control of the liquid-crystal panel and the backlight device.

As illustrated in FIG. 2, the panel controller 13 has a video-signal processing circuit unit 13A, which processes video signals, and a pixel driver 13B, which drives pixels PX included in the liquid-crystal panel 11 based on signals output from the video-signal processing circuit unit 13A. The panel controller 13 is provided on a control substrate. The control substrate is provided with a central processing unit (CPU) 15 that controls operations of the video-signal processing circuit unit 13A, the pixel driver 13B, and a light-source driver 14A. The pixel driver 13B performs driving so that pixel PX rows including the pixels PX, arrayed along in a row direction in the liquid-crystal panel 11, are sequentially scanned along a column direction that is orthogonal to the row direction. As illustrated in FIG. 3, the panel controller 13 controls the liquid-crystal panel 11 so that a red-data writing period in which an image signal for a red display gray scale is supplied to each pixel PX, a red display period in which the red display gray scale (red data) of each pixel PX is held without supplying an image signal, a green-data writing period in which an image signal for a green display gray scale is supplied to each pixel PX, a green display period in which the green display gray scale (green data) of each pixel PX is held without supplying an image signal, a blue-data writing period in which an image signal for a blue display gray scale is supplied to each pixel PX, a blue display period in which the blue display gray scale (blue data) of each pixel PX is held without supplying an image signal, a white-data writing period in which an image signal for a white display gray scale that is the same as the gray scale for the red, green, and blue is supplied to each pixel PX, and a white display period in which the white display gray scale (white data) of each pixel PX is held without supplying an image signal are included in one frame period. FIG. 3 is a chart illustrating timings regarding control on the liquid-crystal panel 11 and the backlight device 12. The field "image signals written to liquid-crystal panel" illustrated in FIG. 3 indicates colors with display gray scales according to image signals supplied to each pixel PX. In the red-data writing period, an image signal for a red display gray scale is supplied to each pixel PX, and in the red display period, the image signal for the red display gray scale is held in each pixel PX, so that a red image is displayed on a display plane of the quid-crystal panel 11. In the green-data writing period, an image signal for a green display gray scale is supplied to each pixel PX, and in the green display period, the image signal for the green display gray scale is held in each pixel PX, so that a green image is displayed on the display plane of the liquid-crystal panel 11. In the blue-data writing period, an image signal for a blue display gray scale is supplied to each pixel PX, and in the blue display period, the image signal for the blue display gray scale is held in each pixel PX, so that a blue image is displayed on the display plane of the liquid-crystal panel 11. In the white-data writing period, an image signal for a white display gray scale is supplied to each pixel PX, and in the white display period, the image signal for the white display gray scale is held in each pixel PX, so that a white image is displayed on the display plane of the liquid-crystal panel 11. The image signal for the white display gray scale and supplied to each pixel PX in the white-data writing period is set so that each of the gray scales for the red, green, and blue is the highest gray scale, the lowest gray scale, or an intermediate gray scale thereof. In this case, when a frame rate for output signals processed by the video-signal processing circuit unit 13A is set to, for example, about 60 frames per second (fps), one frame period is about 1/60 second (about 16.67 millisecond). In the present embodiment, the panel controller 13 controls the liquid-crystal panel 11 so that the red-data writing period, the red display period, the green-data writing period, the green display period, the blue-data writing period, the blue display period, the white-data writing period, and the white display period are included in one frame period, and thus, when times are allocated so that the data writing periods of the respective colors and the display periods of the respective colors are equal to each other, the pixel driver 13B drives each pixel PX so that each of the red-data writing period, the red display period, the green-data writing period, the green display period, the blue-data writing period, the blue display period, the white-data writing period, and the white display period is about 1/480 second (about 2.08 millisecond). Accordingly, in the field sequential system according to the present embodiment, high-speed driving is performed such that the drive frequency of each pixel PX driven by the panel controller 13 is eight times of the drive frequency in a color filter system using a liquid-crystal panel having a color filter, and correspondingly, the charging time of each pixel PX is one-eighth of the charging time in the color filter system. The white-data writing period and the white display period may also be omitted. In such a case, in the field sequential system according to the present embodiment, the drive frequency of each pixel PX driven by the panel controller 13 is six times of the drive frequency in the color filter system using a liquid-crystal panel having a color filter, and thus, the charging time of each pixel PX is one-sixth of the charging time in the color filter system.

Figure 4:
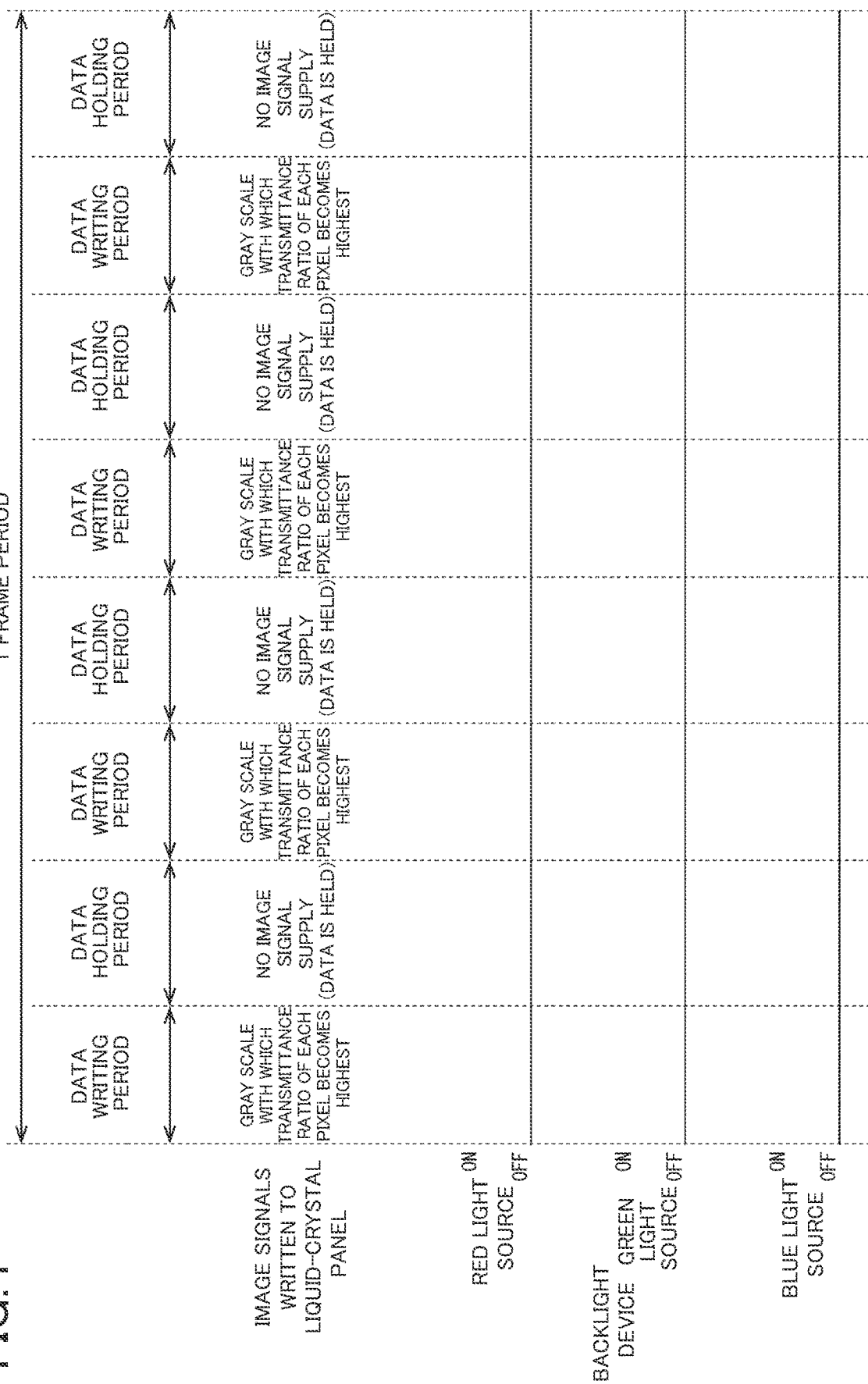
FIG. 4 is a chart illustrating timings regarding control on the liquid-crystal panel and the backlight device.

As illustrated in FIG. 2, the backlight controller 14 has the light-source driver 14A and is provided on an LED drive circuit hoard. The light-source driver 14A drives the red light source 12R, the green light source 12G, and the blue light source 12B, based on signals output from the video-signal processing circuit unit 13A. The light-source driver 14A operates under the control of the CPU 15 provided on the control substrate and is adapted to synchronize with operations of the pixel driver 13B. More specifically, as illustrated in FIG. 3, in the red-data writing period in which an image signal for a red display gray scale is supplied to each pixel PX, the pixel driver 13B turns off the red light source 12R, the green light source 12G, and the blue light source 12B; in the red display period, the pixel driver 13B turns on the red light source 12R and turns off the green light source 12G and the blue light source 12B; in the green-data writing period in which an image signal for a green display gray scale is supplied to each pixel PX, the pixel driver 13B turns off the red light source 12R, the green light source 12G, and the blue light source 12B; in the green display period, the pixel driver 13B turns on the green light source 12G and turns off the red light source 12R and the blue light source 12B; in the blue-data writing period in which an image signal for a blue display gray scale is supplied to each pixel PX, the pixel driver 13B turns off the red light source 12R, the green light source 12G, and the blue light source 12B; in the blue display period, the pixel driver 13B turns on the blue light source 12B, and turns off the red light source 12R and the green light source 12G; in the white-data writing period in which an image signal for a white display gray scale, that is, an image signal for a white display gray scale that is the same as the gray scale for red, green, and blue, is supplied to each pixel PX, the pixel driver 13B turns off the red light source 12R, the green light source 12G, and the blue light source 12B; and in the white display period, the pixel driver 13B turns on the blue light source 12B, the red light source 12R, and the green light source 12G. The field "backlight device" illustrated in FIG. 3 shows a timing chart in which "ON" indicates that the corresponding light source of the red, green, and light sources 12R, 12G, and 12B is turned on, and "OFF" indicates that the corresponding light source is turned off. With this arrangement, in the red display period, the red light emitted from the red light source 12R passes through each pixel PX to which the image signal for a red display gray scale is supplied, so that a red image is displayed on the liquid-crystal panel 11. In the green display period, the green light emitted from the green light source 12G passes through each pixel PX to which the image signal for a green display gray scale is supplied, so that a green image is displayed on the liquid-crystal panel 11. In the blue display period, the blue light emitted from the blue light source 12B passes through each pixel PX to which the image signal for a blue display gray scale is supplied, so that a blue image is displayed on the liquid-crystal panel 11. In a display period of each color, since all of the light sources for the colors that are different from the display color for an image are turned off, the color purities in images of the respective colors are high. Now, a case in which control on the liquid-crystal panel 11 and the backlight device 12 is made different from the control illustrated in FIG. 3 will be described with reference to FIG. 4. FIG. 4 is a chart illustrating timings regarding control on the liquid-crystal panel 11 and the backlight device 12, and contents of each field are analogous to those in FIG. 3. That is, when priority is given to allowing a user to view the object OB (see FIG. 1) that is present at an opposite side of (a reverse side of) the liquid-crystal panel 11 with respect to the backlight device 12, the panel controller 13 supplies a signal indicating a highest transmittance ratio to each pixel PX to bring about a state in which no color display is performed in an entire one frame period, and the backlight controller 14 turns off the red light source 12R, the green light source 120, and the blue light source 12B in the entire one frame period, as illustrated in FIG. 4. At this point in time, when the illumination light source that is installed independently from the backlight device 12 and that is used for illuminating the object OB with illumination light is turned on, the user can clearly view the object OB, illuminated with the illumination light of the illumination source, through the liquid-crystal panel 11 and the light guide plate 12α. Even when the liquid-crystal panel 11 and the backlight device 12 are controlled as illustrated in FIG. 3, illuminating the object OB with the illumination light of the illumination light source allows the user to view the object OB through the liquid-crystal panel 11 and the light guide plate 12α.

Figure 5:
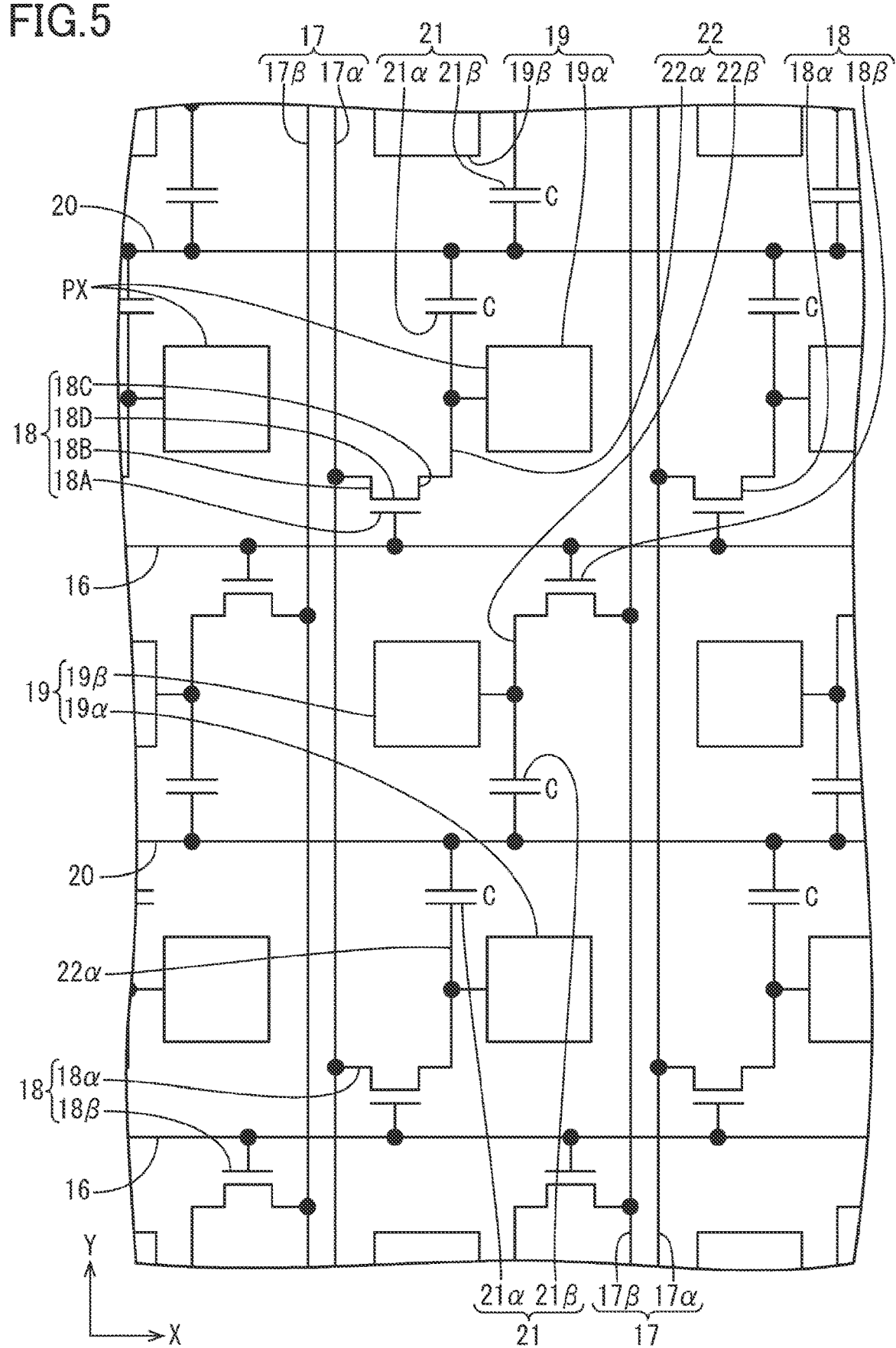
FIG. 5 is a circuit diagram illustrating an array of pixels in the liquid-crystal panel.
Figure 6:
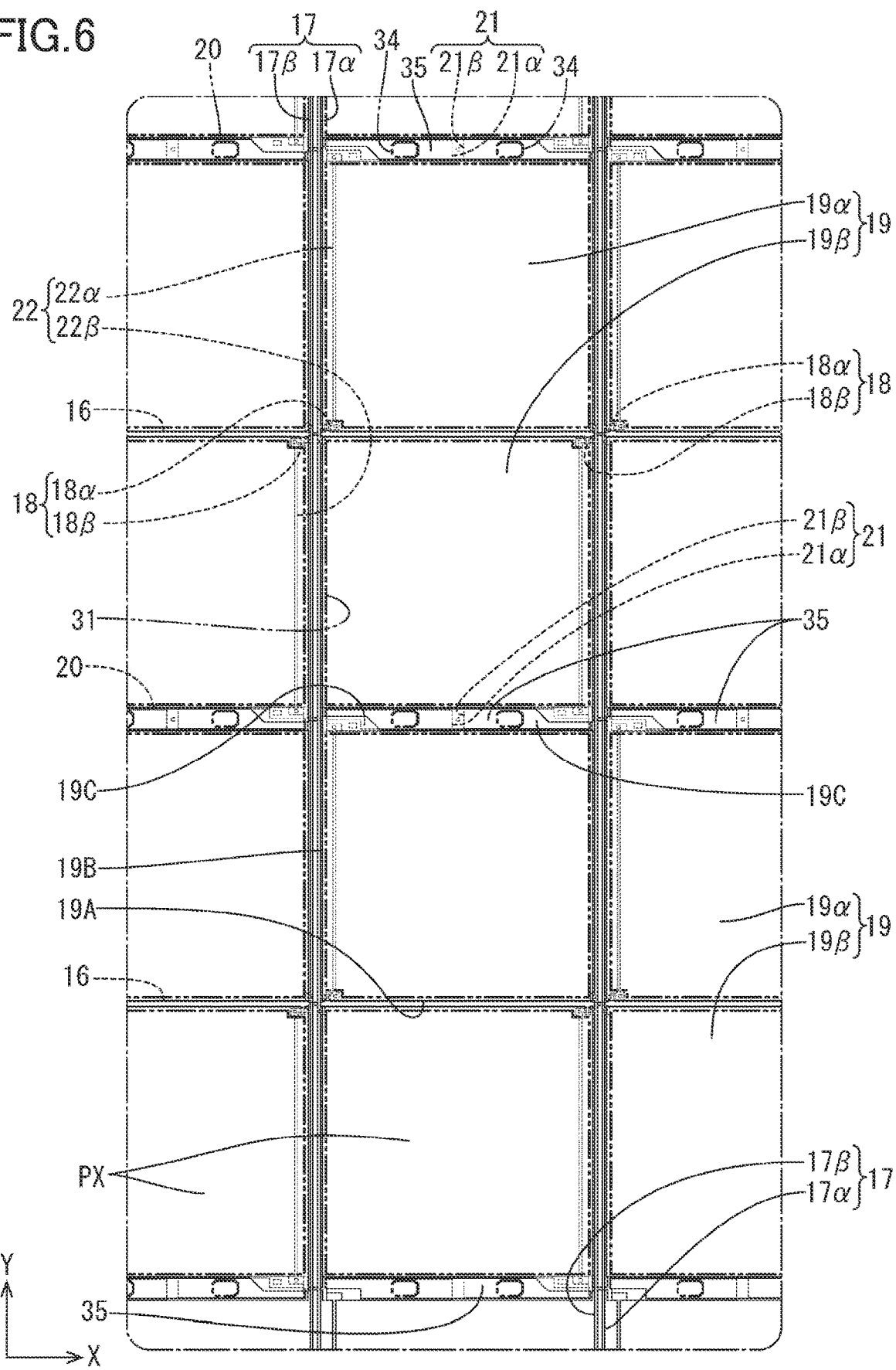
FIG. 6 is a plan view of the array of pixels in the liquid-crystal panel.
Figure 7:
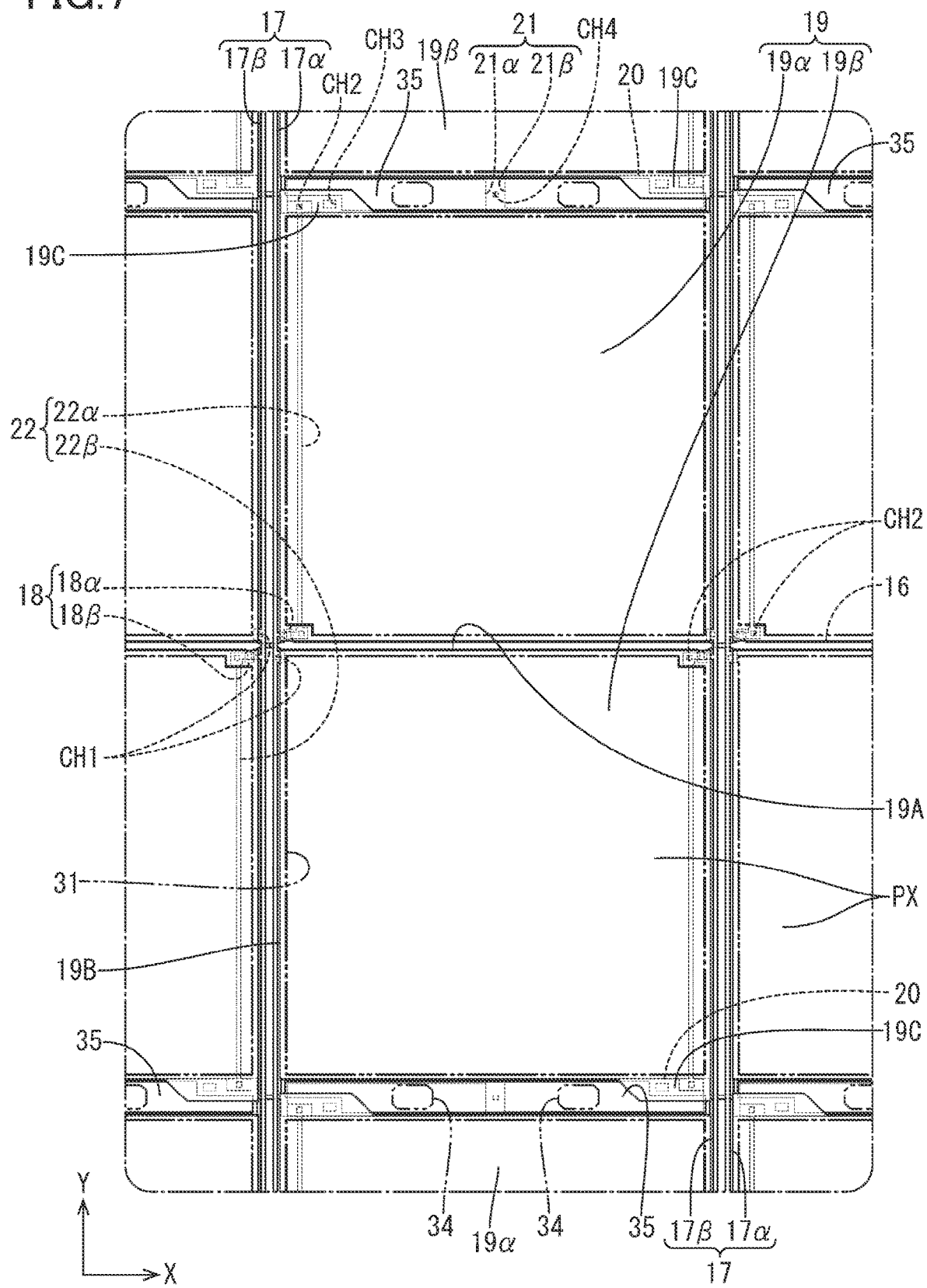
FIG. 7 is an enlarged plan view of a portion in FIG. 6.

Next, the array of pixels PX included in the liquid-crystal panel 11 will be described with reference to FIGS. 5 to 7, as appropriate. FIG. 5 is a circuit diagram illustrating the array of pixels PX in the liquid-crystal panel 11. FIG. 6 is a plan view of the array of pixels PX in the liquid-crystal panel 11. FIG. 7 is an enlarged plan view of a portion in FIG. 6. As illustrated in FIGS. 5 and 6, gate wires (scan wires) 16 and source wires (image wires, signal wires) 17 are disposed in the liquid-crystal panel 11 so as to intersect each other, and TFTs (switching elements) 18 and pixel electrodes 19 are provided in the vicinity of the corresponding portions at which they intersect each other. Scan signals are transmitted through the gate wires 16, which extend along an X-axis direction (the row direction) and are connected to gate electrodes (first electrodes) 18A of the corresponding TFTs 18. Image signals for a display gray scale of each color are transmitted through the source wires 17, which extend along a Y-axis direction (the column direction) that is generally orthogonal to (or that intersects) the extending direction of the gate wires 16 and are connected to source electrodes (second electrodes) 18B of the corresponding TFTs 18.

The TFTs 18 and the pixel electrodes 19 are included in the pixels PX, and two or more TFTs 18 and two or more pixel electrodes 19 are regularly arranged in a plane matrix (or in a row-and-column arrangement) along the X-axis direction and the Y-axis direction, as illustrated in FIGS. 5 and 6. Each pixel electrode 19 has a rectangular shape in plan view. In the present embodiment, as illustrated in FIG. 7, in each pixel electrode 19, a first side portion 19A along the X-axis direction and a second side portion 19B along the Y-axis direction have substantially the same lengths (e.g., about 447 µm), and thus the pixel electrode 19 has a square shape in plan view. In the present embodiment, the reason why the pixel electrode 19 has a square shape is that three colors, that is, red, green, and blue, can be displayed with one pixel electrode 19 based on the field sequential system. As illustrated in FIG. 5, each pixel electrode 19 is electrically connected to a drain electrode (a third electrode) 18C of the TFT 18. In addition to the gate electrode 18A, the source electrode 18B, and the drain electrode 18C, each TFT 18 has a channel portion 18D that provides connection between the source electrode 18B and the drain electrode 18C. When the TFT 18 is driven based on a scan signal transmitted through the gate wire 16, an image signal transmitted through the source wire 17 is transmitted from the source electrode 18B to the drain electrode 18C via the channel portion 18D, so that the corresponding pixel electrode 19 can be charged to a potential based on the image signal.

As illustrated in FIGS. 5 and 6, the gate wires 16 are arranged away from each other so that two pixel electrodes 19 are interposed therebetween in the Y-axis direction. That is, the gate wires 16 are alternately disposed in spaces provided between the pixel electrodes 19 that are adjacent to each other in the Y-axis direction. Accordingly, the number of gate wires 16 that are disposed is about half the number of pixel electrodes 19 that are disposed in the Y-axis direction. Meanwhile, two source wires 17 are disposed between the pixel electrodes 19 that are adjacent to each other in the X-axis direction. Accordingly, the number of source wires 17 that are disposed is about twice the number of pixel electrodes 19 that are disposed in the X-axis direction. A pair of two TFTs 18 that are respectively connected to two source wires 17 disposed between the pixel electrodes 19 that are adjacent to each other in the X-axis direction is repeatedly disposed at positions that are diagonally opposite to each other across, the gate wire 16, so as to form a zigzag shape (a staggered shape). The TFTs 18 included in each of the pairs are respectively connected to two pixel electrodes 19 that are adjacent to each other across the gate wire 16. Accordingly, based on scan signals transmitted through one gate wire 16, two pixel PX rows (one odd-numbered pixel PX row and one even-numbered pixel PX row) that are adjacent to each other across the gate wire 16 are adapted to be driven. Hereinafter, the odd-numbered pixel electrode 19, counted from an end in the Y-axis direction (e.g., an upper end in FIGS. 5 and 6) and the TFT 18 connected to this pixel electrode 19 are respectively referred to as a "first pixel electrode 19α" and a "first TFT 18α", and the even-numbered pixel electrode 19, counted from the end in the Y-axis direction, and the TFT 18 connected to this pixel electrode 19 are respectively referred to as a "second pixel electrode 19β" and a "second TFT 18β". Also, hereinafter, the source wire 17 connected to the first TFT (a first switching element) 18α is referred to as a "first source wire 17α", and the source wire 17 connected to the second TFT (a second switching element) 18β is referred to as a "second source wire 17β". The first source wire 17α is located at the right side in FIGS. 5 to 7 and between the pixel electrodes 19 that are adjacent to each other in the X-axis direction, and the second source wire 17β is located at the left side in FIGS. 5 to 7 and between the pixel electrodes 19. A first image signal is transmitted through the first source wire 17α, whereas a second image signal that is different from the first image signal is transmitted through the second source wire 17β. The gate wire 16 is disposed so as to be located between the first pixel electrode 19α and the second pixel electrode 19β that are adjacent to each other in the Y-axis direction and is connected to both the first TFT 18α and the second TFT 18β to which the first pixel electrode 19α and the second pixel electrode 19β are respectively connected.

As illustrated in FIGS. 5 and 6, the liquid-crystal panel 11 is provided with capacitance wires 20 that extend along the X-axis direction, which is the extending direction of the gate wires 16, and that are maintained at a substantially constant reference potential. Each pixel electrode 19 is located between the capacitance wire 20 and the gate wire 16 in the Y-axis direction, and each capacitance wire 20 is located between two pixel electrodes 19 located between two gate wires 16. That is, the capacitance wire 20 is disposed utilizing space provided between two pixel electrodes 19 located between two gate wires 16. The gate wire 16 and the capacitance wire 20 are disposed so that they are alternately and repeatedly arranged in the Y-axis direction. The number of capacitance wires 20 that are disposed is about half of the number of pixel electrodes 19 in the Y-axis direction and is substantially the same as the number of gate wires 16 that are disposed.

As illustrated in FIGS. 5 and 6, a capacitance forming electrode 21 connected to each pixel electrode 19 is arranged to overlap the capacitance wire 20. Formation of an electrostatic capacitance C between the capacitance forming electrode 21 and the capacitance wire 20, which are at the same potential as that of the pixel electrode 19, makes it possible to stably hold the potential of the pixel electrode 19 charged by the TFT 18. The capacitance forming electrode 21 has a horizontally long shape that extends along the X-axis direction, which is an extending direction of the capacitance wire 20, as illustrated in FIG. 7, and most parts of the capacitance forming electrode 21 are disposed so as to overlap the capacitance wire 20. The capacitance forming electrode 21 is directly connected to the pixel electrode 19, whereas the capacitance forming electrode 21 is indirectly connected to the drain electrode 18C of the TFT 18 through a connection wire (a drain wire) 22. The connection wire 22 is disposed at a position slightly spaced away from the source wire 17 in the X-axis direction and also extends along the Y-axis direction, which is an extending direction of the source wire 17, and one end of the connection wire 22 is connected to the drain electrode 18C of the TFT 18, and another end of the connection wire 22 is connected to the capacitance forming electrode 21. Accordingly, the connection wire 22 extends along substantially the entire length of the pixel electrode 19 in the Y-axis direction. Hereinafter, the connection wire 22 connected to the first TFT 18α and the capacitance forming electrode 21 connected to the connection wire 22 are respectively referred to as a "first connection wire 22α" and a "first capacitance forming electrode 21α", and the connection wire 22 connected to the second TFT 18β and the capacitance forming electrode 21 connected to the connection wire 22 are respectively referred to as a "second connection wire 22β" and a "second capacitance forming electrode 21β".

Figure 8:
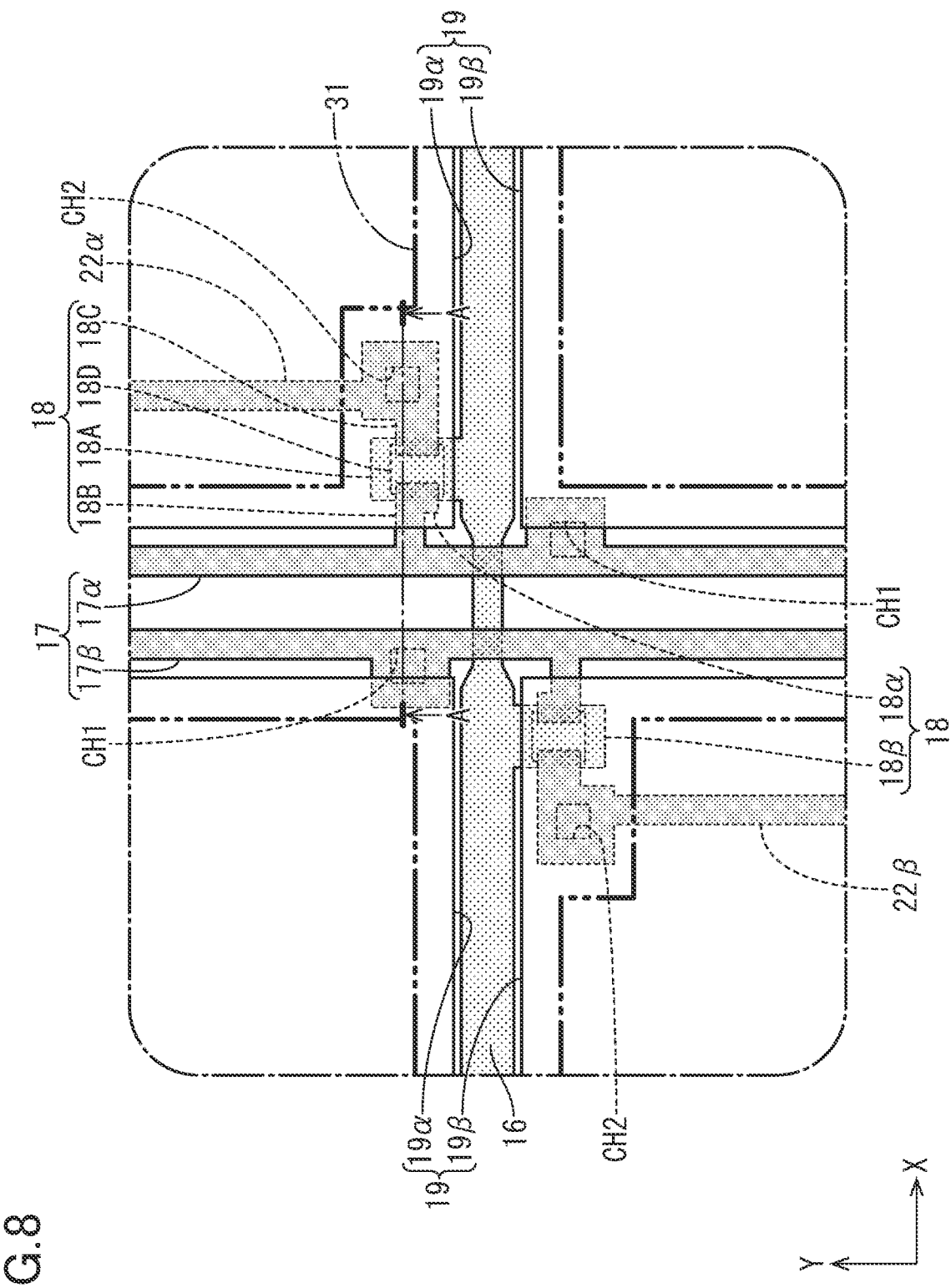
FIG. 8 is an enlarged plan view of a portion in the vicinity of TFTs in the liquid-crystal panel.
Figure 9:
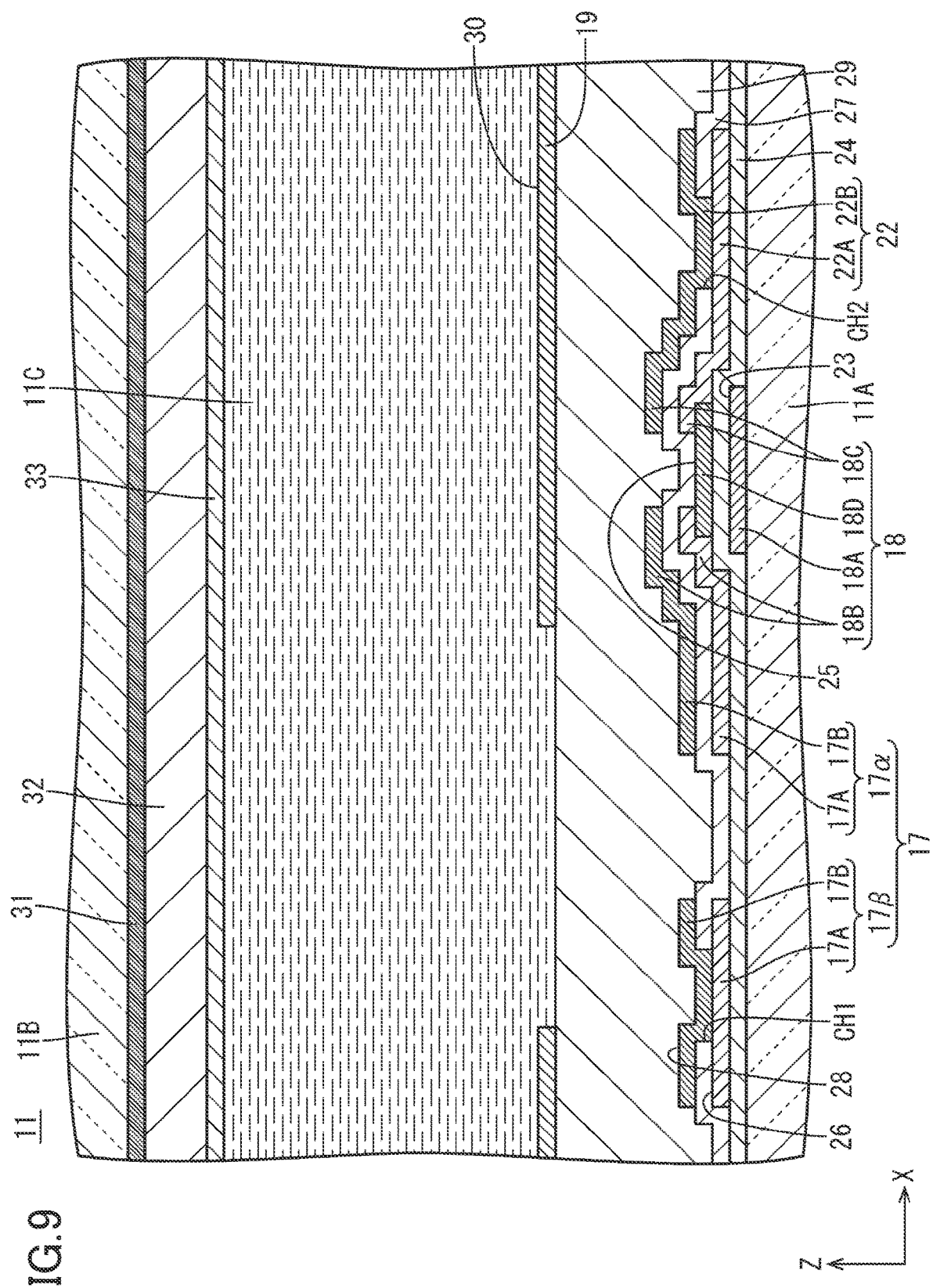
FIG. 9 is a sectional view of the liquid-crystal panel, taken along line A-A in FIG. 8.

Now, a detailed description of the TFTs 18 will be described with reference to FIGS. 8 and 9. FIG. 8 is an enlarged plan view of a portion in the vicinity of the TFTs 18 in the liquid-crystal panel 11. In FIG. 8, the formation range of a first metal film 23, which is described below, and the formation range of a second metal film 26, which is described below, are depicted by different hatching patterns. FIG. 9 is a sectional view of a portion in the vicinity of one TFT 18 in the liquid-crystal panel 11. As illustrated in FIG. 8, the TFT 18 is disposed in the vicinity of a corner portion of the pixel electrode 19 to which the TFT 18 is connected, the corner portion being adjacent to the intersection portion of the gate wire 16 and the source wire 17. The TFT 18 has the gate electrode 18A that branches from the gate wire 16. The gate electrode 18A is disposed at a position included in the gate wire 16 and that is closer to the pixel electrode 19 to which the gate electrode 18A is connected than the source wire 17 in the X-axis direction. The line width of the gate wire 16 varies depending on its position in the X-axis direction, and a portion of the gate wire 16 which intersects the source wire 17 has a smaller width than the line width of other portions of the gate wire 16. The TFT 18 has the source electrode 18B that branches from the source wire 17. The source electrode 18B is disposed at a position that is closer to the pixel electrode 19 to which the source electrode 18B is connected than the gate wire 16 in the Y-axis direction. The TFT 18 has the drain electrode 18C that is disposed away from the source electrode 18B in the X-axis direction. An end portion of the drain electrode 18C, the end portion being located at an opposite side to the source electrode 18B (the channel portion 18D), is connected to the connection wire 22. The TFT 18 has the channel portion 18D that overlaps the gate electrode 18A and that is coupled to the source electrode 18B and the drain electrode 18C. The channel portion 18D extends along the X-axis direction. One end of the channel portion 18D is coupled to the source electrode 18B, and another end of channel portion 18D is coupled to the drain electrode 18C.

Next, a pair of substrates 11A and 11B that are included in the liquid-crystal panel 11 will be described with reference to FIG. 9. As illustrated in FIG. 9, the gate wires 16, the source wires 17, the TFTs 18, the pixel electrodes 19, the capacitance wires 20, the capacitance forming electrodes 21, and the connection wires 22, which are described above, are provided above the array substrate 11A, which is included in the liquid-crystal panel 11. The liquid-crystal panel 11 has the array substrate 11A, the counter substrate 11B laminated to the array substrate 11A, and a liquid-crystal layer 11C sandwiched between the array substrate 11A and the counter substrate 11B. The array substrate 11A and the counter substrate 11B each have a glass substrate. Now, a detailed description will be given of various types of film stacked on the glass substrate of the array substrate 11A. At least a first metal film (an electrically conductive film) 23, a gate insulating film 24, a semiconductor film 25, a second metal film (an electrically conductive film) 26, an interlayer insulating film 27, a third metal film (an electrically conductive film) 28, a planarization film (an insulating film) 29, a transparent electrode film 30, and an alignment film are stacked and formed on the glass substrate of the array substrate 11A sequentially from the lower layer side (the glass substrate side).

The first metal film 23, the second metal film 26, and the third metal film 28 are each constituted by a single-layer film made of one type of metallic material selected from copper, titanium, aluminum, molybdenum, tungsten, and so on or a single-layer film or alloy made of different types of metallic material selected therefrom and have electrical conductivity. The first metal film 23 constitutes the gate wire 16, the gate electrode 18A of the TFT 18, the capacitance wire 20, and so on (see FIG. 7). The second metal film 26 constitutes a part of the source wire 17, a part of the source electrode 18B of the TFT 18, a part of the drain electrode 18D thereof, the capacitance forming electrode 21, a part of the connection wire 22, and so on (see FIG. 7). The third metal film 28 constitutes a part of the source wire 17, a part of the source electrode 18B of the TFT 18, a part of the drain electrode 18D thereof, a part of the connection wire 22, and so on (see FIG. 7). The semiconductor film 25 is constituted by a thin film using, for example, semiconducting material, such as oxide semiconductor or amorphous and constitutes the channel portion 18D of the TFT 18 and so on. The gate insulating film 24 and the interlayer insulating film 27 are each made of inorganic material, such as a silicon nitride ($SiN_x$) or a silicon oxide ($SiO_2$). The gate insulating film 24 is interposed between the first metal film 23 and the semiconductor film 25 to provide insulation therebetween and is interposed between the first metal film 23 and the second metal film 26 to provide insulation therebetween. The interlayer insulating film 27 is interposed between the semiconductor film 25 and the third metal film 28 to provide insulation therebetween and is interposed between the second metal film 26 and the third metal film 28 to provide insulation therebetween. The planarization film 29 is made of organic material, such as polymethyl methacrylate (PMMA, an acrylic resin) and is interposed between the third metal film 28 and the transparent electrode film 30 to provide insulation therebetween. The transparent electrode film 30 is made of a transparent electrode material (e.g., indium tin oxide (ITO) or indium zinc oxide (IZO)) and constitutes the pixel electrode 19 and so on (see FIG. 7).

As illustrated in FIGS. 8 and 9, the counter substrate 11B has a generally lattice-like light-shielding portion (a black matrix) 31, which has openings at portions that overlap the corresponding pixel electrodes 19. The light-shielding portion 31 is arranged to overlap the gate wires 16, the source wires 17, the TFTs 18, and so on. In the counter substrate 11B an overcoat film 32 for planarization is formed at the lower layer side of the light-shielding portion 31. In addition, a counter electrode 33 is formed at the lower layer side of the overcoat film 32. The counter electrode 33 is uniformly provided in a plate plane of the counter substrate 11B and faces all the pixel electrodes 19 with the liquid-crystal layer 11C being interposed therebetween. When a reference potential is supplied to the counter electrode 33, a potential difference occurs between the counter electrode 33 and the pixel electrodes 19 charged by the TFTs 18. Based on the potential difference, the alignment state of liquid-crystal molecules in the liquid-crystal layer 11C varies to thereby allow predetermined gray scale display to be performed for each pixel. The display mode of the liquid-crystal panel 11 according to the present embodiment is a twisted nematic (TN) mode. Also, the counter substrate 11B is provided with spacers 34 for maintaining the thickness (a cell gap) of of the liquid-crystal layer 11O (see FIGS. 7 and 13). Each spacer 34 is arranged in a plane so as to overlap a part of the capacitance wire 20. Also, the alignment film is also provided at the lower-most layer side in the counter substrate 11B.

Subsequently, a detailed description of the source wire 17 and the connection wire 22 will be described with reference to FIGS. 7 to 9, as appropriate. As illustrated in FIG. 9, the source wire 17 has a laminated structure of a first source-wire constituent portion 17A, which is constituted by the second metal film 26, and a second source-wire constituent portion 17B, which is constituted by the third metal film 28. The first source-wire constituent portion 17A and the second source-wire constituent portion 17B extend along the Y-axis direction and are disposed so as to overlap each other via the interlayer insulating film 27 interposed therebetween, that is, with the interlayer insulating film 27 being interposed therebetween. The first source-wire constituent portion 17A and the second source-wire constituent portion 17B are interconnected through a source-wire contact hole CH1 provided in the interlayer insulating film 27, which is interposed between first source-wire constituent portion 17A and the second source-wire constituent portion 17B. As illustrated in FIGS. 7 and 8, the source-wire contact holes CH1 are disposed at positions between which the gate wire 16 is located in the Y-axis direction with respect to the TFTs 18. The number of source-wire contact holes CH1 that are disposed is substantially the same as the number of gate wires 16 that are disposed. Accordingly, even if one of the first source-wire constituent portion 17A and the second source-wire constituent portion 17B is disconnected, the other source-wire constituent portion 17A or 17B can continue transmission of image signals, thus improving the redundancy of the source wires 17. As illustrated in FIG. 9, the source electrode 18B of the TFT 18, the source electrode 18B branching from the source wire 17, also has a laminated structure that is similar to that of the source wire 17.

As illustrated in FIG. 9, the connection wire 22 has a laminated structure of a first connection-wire constituent portion 22A, which is constituted by the second metal film 26, and a second connection-wire constituent portion 22B, which is constituted by the third metal film 28. The first connection-wire constituent portion 22A and the second connection-wire constituent portion 22B both extend along the Y-axis direction and are also disposed so as to overlap each other via the interlayer insulating film 27. The first connection-wire constituent portion 22A and the second connection-wire constituent portion 22B are inter-connected through a connection-wire contact hole CH2 provided in the interlayer insulating film 27, which is interposed between the first connection-wire constituent portion 22A and the second connection-wire constituent portion 22B. The connection-wire contact holes CH2 are respectively disposed in the vicinities of the positions of both ends of the connection wire 22 in the Y-axis direction, as illustrated in FIGS. 7 and 8. Accordingly, even if one of the first connection-wire constituent portion 22A and the second connection-wire constituent portion 22B is disconnected, the other connection wire constituent portion 22A or 22B can continue transmission of image signals, thus improving redundancy of the connection wire 22. As illustrated in FIG. 9, the drain electrode 18C of the TFT 18, the drain electrode 18C being directly coupled to the connection wire 22, also has a laminated structure that is similar to that of the connection wire 22.

Figure 10:
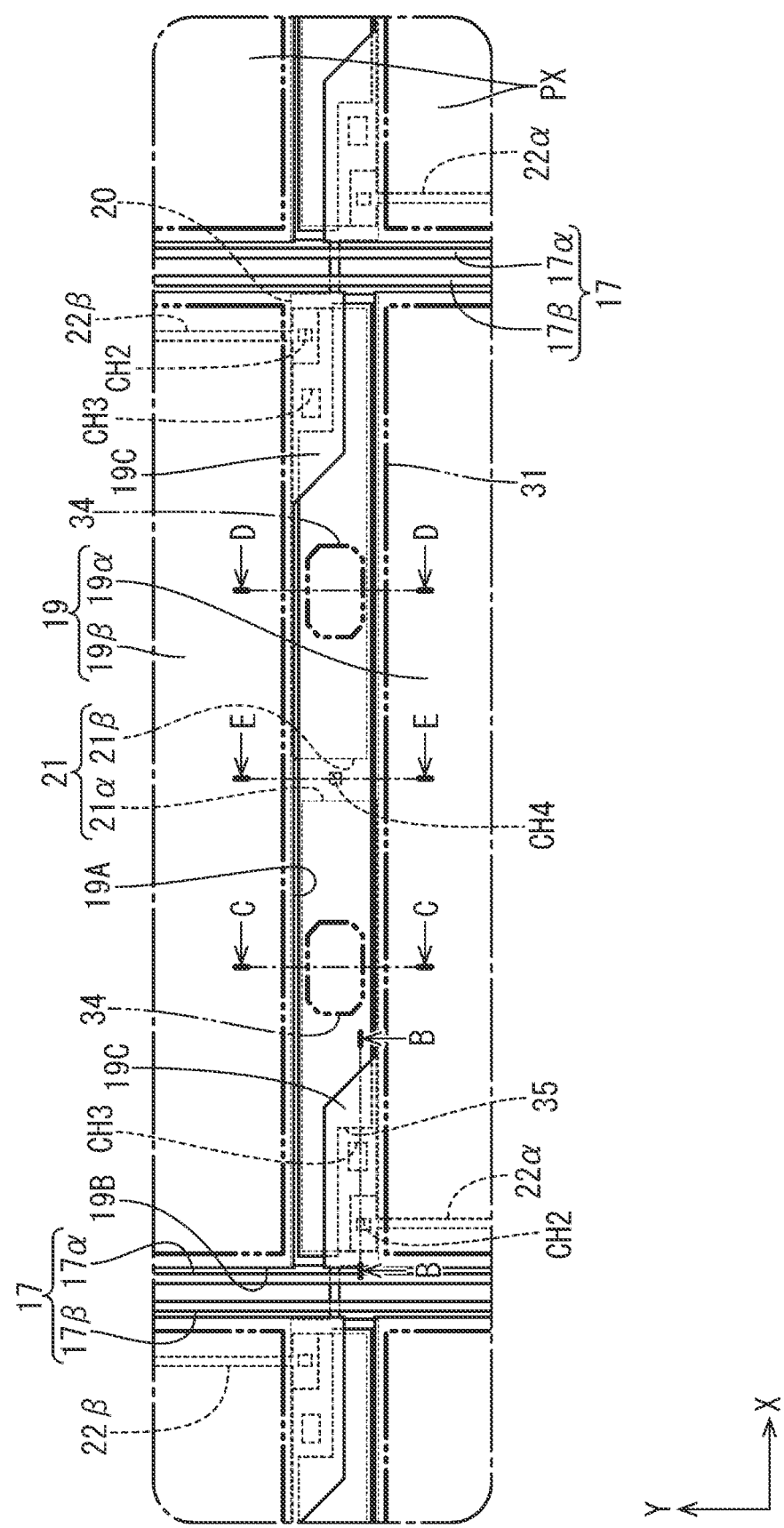
FIG. 10 is an enlarged plan view of a portion in the vicinity of a capacitance wire the liquid-crystal panel.
Figure 11:
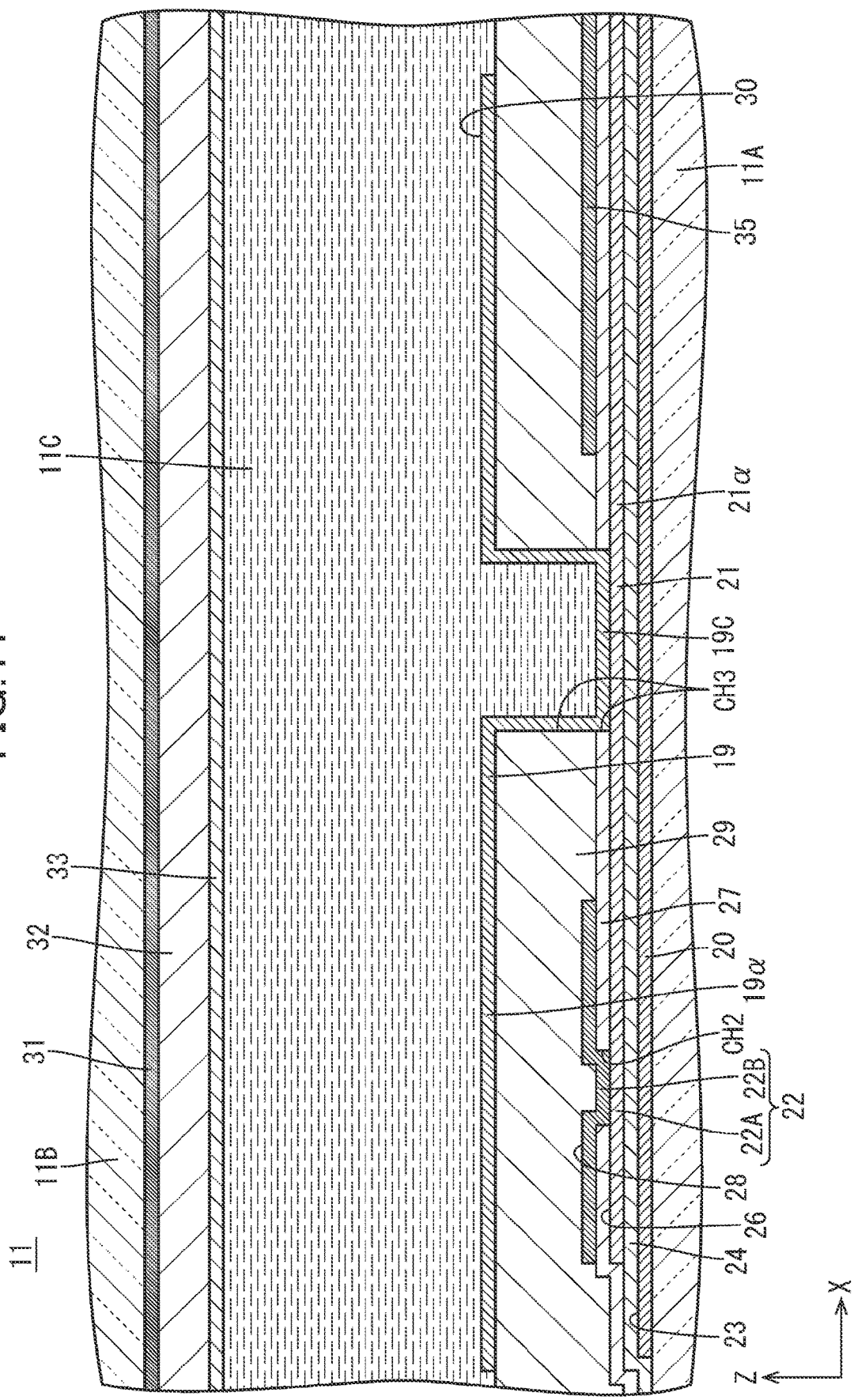
FIG. 11 is a sectional view of the liquid-crystal panel, taken along line B-B in FIG. 10.

Next, a detailed description of the capacitance wire 20 and the capacitance forming electrode 21 will be described with reference to FIGS. 10 and 11, as appropriate. FIG. 10 is an enlarged plan view of a portion in the vicinity of a capacitance wire 20 in the liquid-crystal panel 11. FIG. 11 is a sectional view of a portion in the vicinity of a connection portion of the pixel electrode 19 and the capacitance forming electrode 21 in the liquid-crystal panel 11. First, as illustrated in FIG. 10, the line width of each capacitance wire 20 varies depending on its position in the X-axis direction. That is, the capacitance wire 20 has a large-width portion located between the pixel electrodes 19 that are adjacent to each other in the Y-axis direction and a small-width portion that intersects the corresponding source wire 17. The capacitance forming electrode 21 is arranged to overlap the large-width portion of the capacitance wire 20. The capacitance forming electrode 21 has a horizontally long, generally belt-like shape that extends along the X-axis direction, has a slightly smaller width than the large-width portion of the capacitance wire 20, and has a length dimension that is slightly less than about half of the dimension of the first side portion 19A of the pixel electrode 19. The first capacitance forming electrode 21α connected to the first pixel electrode 19α of the first and second pixel electrodes 19α and 19β that are adjacent to each other across the capacitance wire 20 and the second capacitance forming electrode 21β connected to the second pixel electrode 19β are disposed so as to overlap the same capacitance wire 20 located between the first pixel electrode 19α and the second pixel electrode 19β. More specifically, the first capacitance forming electrode 21α is located at the left side (i.e., adjacent to the first TFT 18α) in FIG. 10 in the X-axis direction, whereas the second capacitance forming electrode 21β is located at the right side (i.e., adjacent to the second TFT 18β) in FIG. 10 in the X-axis direction and is spaced a predetermined distance away from the first capacitance forming electrode 21α. Since the capacitance forming electrode 21 is constituted by the second metal film 26, as illustrated in FIG. 11, the capacitance forming electrode 21 is arranged to overlap the capacitance wire 20, which is constituted by the first metal film 23, via the gate insulating film 24.

As illustrated in FIG. 10, each pixel electrode 19 has an extension portion 19C that is disposed so as to overlap a part of the capacitance forming electrode 21 to which the pixel electrode 19 is connected. Each extension portion 19C is disposed at a corner portion of the pixel electrode 19, the corner portion being adjacent to the intersection portion of the source wire 17 and the capacitance wire 20, and protrudes toward the pixel electrode 19 that is adjacent to the extension portion 19C across the capacitance wire 20 in the Y-axis direction. As illustrated in FIG. 11, the extension portion 19C of the pixel electrode 19 and the capacitance forming electrode 21, the extension portion 190 and the capacitance forming electrode 21 overlapping each other, are connected to each other through a pixel-electrode contact hole CH3 provided in the interlayer insulating film 27 and the planarization film 29, which are interposed between the pixel electrode 19 and the capacitance forming electrode 21. The capacitance forming electrode 21, which is constituted by the second metal film 26, is directly coupled to the first connection-wire constituent portion 22A of the connection wire 22. FIG. 11 illustrates a connection structure (the connection-wire contact hole CH2) of the second connection-wire constituent portion 22B and the first connection-wire constituent portion 22A, the connection structure being adjacent to the capacitance forming electrode 21. The pixel-electrode contact hole CH3 is located more adjacent to a center of the pixel electrode 19 in the X-axis direction than the connection-wire contact hole CH2.

Meanwhile, in the liquid-crystal panel 11 according to the present embodiment, although the first TFT 18α and the second TFT 18β that are respectively connected to the first pixel electrode 19α and the second pixel electrode 19β that are adjacent to each other across the gate wire 16 in the Y-axis direction are connected to the respective different source wires 17, the first TFT 18α and the second TFT 18β are connected to the same gate wire 16, as illustrated in FIGS. 5 and 6, and are thus driven at the same timing. Meanwhile, the first TFT 18α and the second TFT 18β that are respectively connected to the first pixel electrode 19α and the second pixel electrode 19β that are adjacent to each other across the capacitance wire 20 in the Y-axis direction are connected to the different gate wires 16 and are thus driven at different timings. Specifically, the second TFT 18β to which the second pixel electrode 19β of the first and second pixel electrodes 19α and 19β that are adjacent to each other across the capacitance wire 20 in the Y-axis direction is connected is connected to the gate wire 16 located at an upper stage (the upper side in FIGS. 5 and 6; at a prior stage in the scan direction) than the gate wire 16 connected to the first TFT 18α to which the first pixel electrode 19α is connected. A drive system utilizing such a pixel array has an advantage in that, in a field sequential system in which the amount of time allocated to charging the pixel electrodes 19 for one screen is reduced to about one-eighth to one-sixth of the amount of time in a typical color filter system, the amount of time allocated to charging the pixel electrodes 19 can be increased (e.g., to about one-fourth to one-third of the amount of time in a typical color filter system). However, the above-described drive system has issues as described below. When a drive system in which a scan signal is sequentially input to the gate wires 16 from the upper side toward the lower side in FIGS. 5 and 6 is employed, the second pixel electrode 19β of the first and second pixel electrodes 19α and 19β that are adjacent to each other across the capacitance wire 20 in the Y-axis direction is charged earlier, and then the first pixel electrode 19α is charged. When a parasitic capacitance occurs between the second pixel electrode 19β that is charged earlier and the first pixel electrode 19α at a timing at which the first pixel electrode 19α is charged, the potential of the second pixel electrode 19β varies upon the charging of the first pixel electrode 19α, and the display gray scale differs from an intended display gray scale and can be seen as display unevenness. In particular, in the present embodiment, since the first capacitance forming electrode 21α connected to the first pixel electrode 19α and the second capacitance forming electrode 21β connected to the second pixel electrode 19β are disposed so as to overlap the same capacitance wire 20, the first capacitance forming electrode 21α and the second pixel electrode 19β have a close positional relationship, and thus an electric field that occurs therebetween tends an be strengthen, which can lead to generation of a parasitic capacitance. Moreover, in the liquid-crystal panel 11 according to the present embodiment, since the plane shape of each pixel electrode 19 has a square shape owing to employment of the field sequential system, and the length of the first side portion 19A along the capacitance wire 20 is substantially the same as the length of the second side portion 19B along the source wire 17, the parasitic capacitance that occurs between the first capacitance forming electrode 21α and the second pixel electrode 19β tends to increase compared with a pixel electrode having a vertically long shape in which the length of a first side portion is about one-third of the length of a second side portion in the color filter system.

Figure 12:
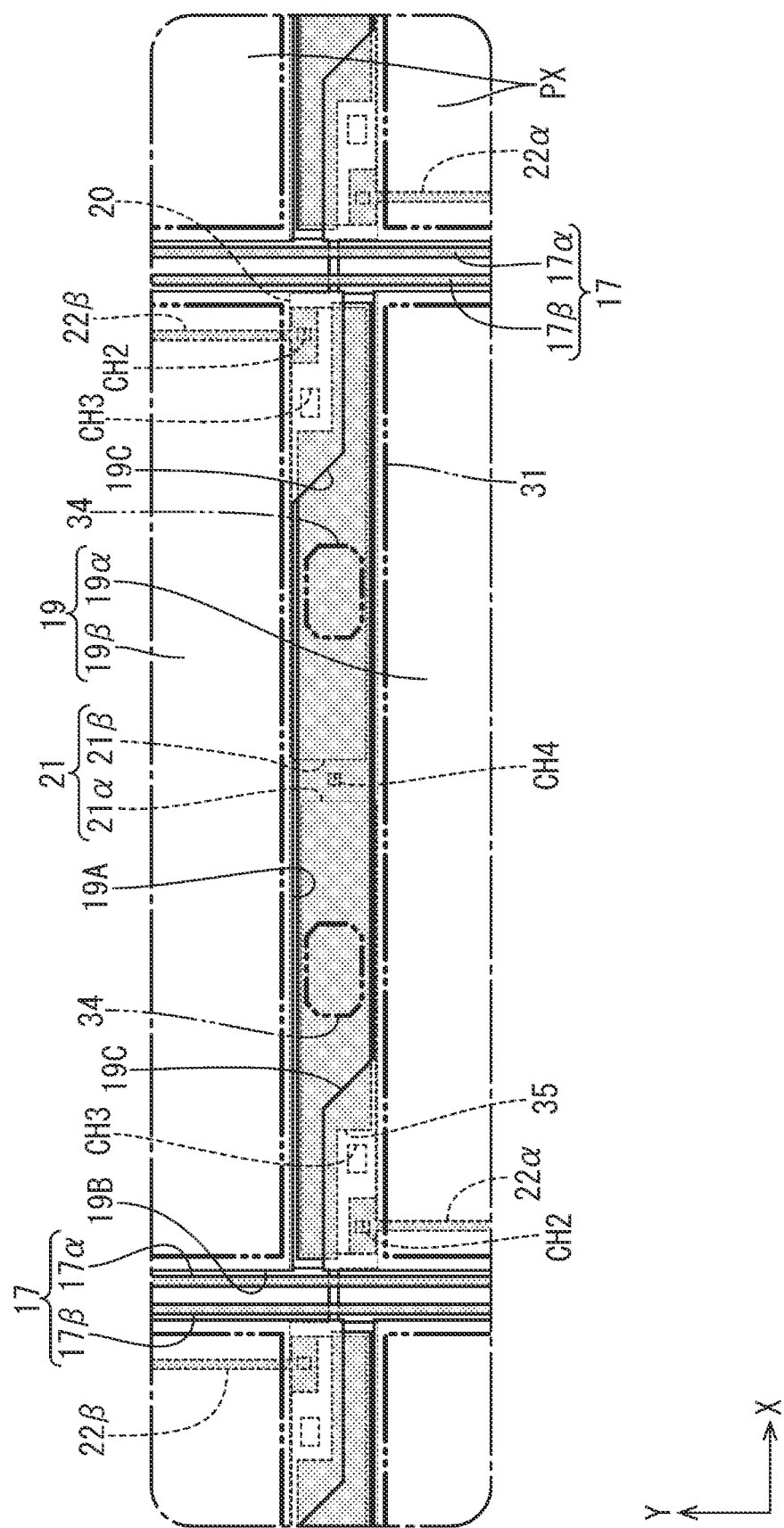
FIG. 12 is a plan view mainly illustrating a pattern of a third metal film in a configuration in the vicinity of the capacitance wire the liquid-crystal panel.
Figure 13:
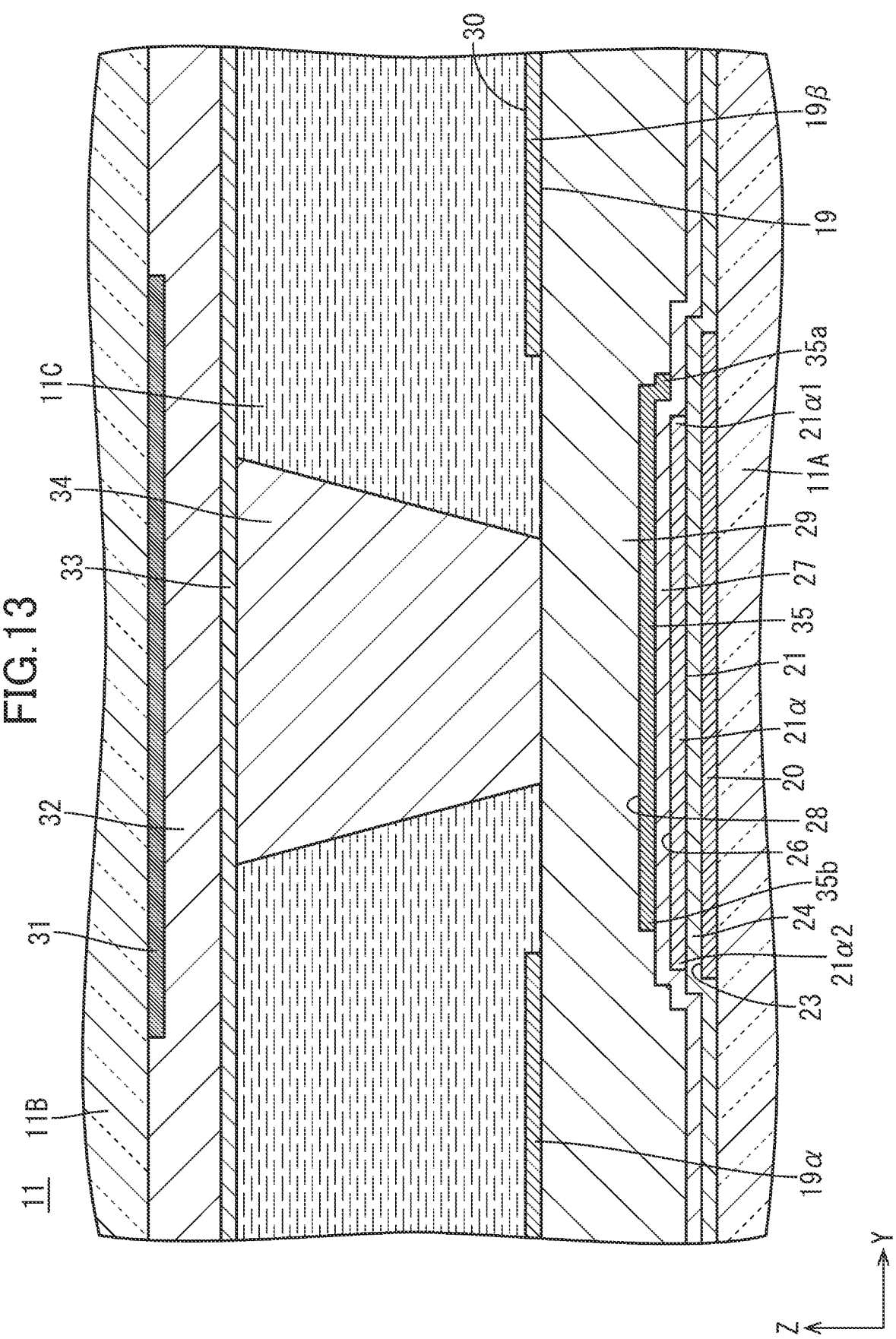
FIG. 13 is a sectional view of the liquid-crystal panel, taken along line C-C in FIG. 10.

Accordingly, in the present embodiment, as illustrated in FIGS. 12 and 13, a shield electrode 35 is disposed so as to be located between the first pixel electrode 19α and the second pixel electrode 19β and so as to at least partially overlap the first capacitance forming electrode 21α via the insulating film 27. FIG. 12 is an enlarged plan view of a portion in the vicinity of the capacitance wire 20 in the liquid-crystal panel 11 and illustrates the formation range of the third metal film 28 by hatching. FIG. 13 is a sectional view of the shield electrode 35, the first capacitance forming electrode 21α, and so on in the liquid-crystal panel 11 (a sectional view along line C-C FIG. 10). According to such a configuration, an electric field that can occur between the second pixel electrode 19β and the first capacitance forming electrode 21α is favorably shielded by the shield electrode 35. Thus, even with the drive system in which the second pixel electrode 19β of the first and second pixel electrodes 19α and 19β that are adjacent to each other across the capacitance wire 20 is charged earlier than the first pixel electrode 19α, the potential of the second pixel electrode 19β becomes less likely to vary, thus suppressing a display quality decline due to the parasitic capacitance that occurs between the second pixel electrode 19β and the first capacitance forming electrode 21α. Moreover, since the first capacitance forming electrode 21α and the shield electrode 35 are both arranged to overlap the capacitance wire 20, the overlapping area of the capacitance wire 20 and the first capacitance forming electrode 21α is sufficiently ensured, so that the potential of the first pixel electrode 19α is more stably held. Since the above-described arrangement makes the potentials of both the first pixel electrode 19α and the second pixel electrode 19β to less likely to vary, a display quality decline is suppressed. In particular, the above-described arrangement is favorable in a case in which the charging time of each of the pixel electrodes 19α and 19β decreases owing to employment of the field sequential system or a case in which the length of the first side portion 19A of each of the pixel electrodes 19α and 19β is substantially the same as the length of the second side portion 19B.

As illustrated in FIG. 12, the shield electrode 35 is disposed so as to overlap both the first capacitance forming electrode 21α and the second capacitance forming electrode 21β via the interlayer insulating film 27, the first capacitance forming electrode 21α and the second capacitance forming electrode 21β being respectively connected to the first pixel electrode 19α and the second pixel electrode 19β that are disposed so that the capacitance wire 20 is located therebetween. The shield electrode 35 has a horizontally long, generally belt-like shape that extends along the X-axis direction. The length dimension of the shield electrode 35 is larger than or equal to twice the length dimension of the capacitance forming electrode 21 and is equivalent to the length dimension of the first side portion 19A of the pixel electrode 19. Thus, the first capacitance forming electrode 21α and the second capacitance forming electrode 21β that are arranged to overlap the same capacitance wire 20 and that are disposed away from each other along the X-axis direction have a relationship of being collectively covered by one shield electrode 35 from the upper layer side. Also, although the width dimensions of most parts of the shield electrode 35 are larger than the width dimension of the capacitance forming electrode 21, the width dimensions of the most parts are made smaller than the width dimension of the capacitance wire 20. End portions of the shield electrode 35, the end portions being adjacent to the source wires 17 in the X-axis direction, are made to have a small width so as not to overlap the connection portion (i.e., the pixel-electrode contact hole CH3) of the pixel electrode 19 and the capacitance forming electrode 21 and a connection portion (i.e., the connection-wire contact hole CH2) of the capacitance forming electrode 21 and the connection wire 22. Thus, since the shield electrode 35 is disposed so as to overlap the second capacitance forming electrode 21β, in addition to the first capacitance forming electrode 21α, via the interlayer film 27, an electric field that can occur between the first pixel electrode 19α and the second capacitance forming electrode 21β is favorably shielded by the shield electrode 35. This makes the potential of the first pixel electrode 19α less likely to vary immediately after charging of image signals is started on the first pixel electrode 19α, thus suppressing a display quality decline due to the parasitic capacitance that occurs between the first pixel electrode 19α and the second capacitance forming electrode 21β. Also, in a display device in which a direction in which scan signals are sequentially input to the gate wires 16 is switchable (from the upper side to the lower side or from the lower side to the upper side in FIGS. 5 and 6), a decline in the display quality is suppressed whichever direction is selected, which is favorable. Moreover, since the second capacitance forming electrode 21β and the shield electrode 35 are both arranged to overlap the capacitance wire 20, the overlapping area of the capacitance wire 20 and the second capacitance forming electrode 21β is sufficiently ensured, so that the potential of the second pixel electrode 19β is more stably held.

The shield electrode 35 is constituted by the third metal film 28, as illustrated in FIG. 13. Accordingly, the shield electrode 35 is disposed at an upper layer side relative to the first and second capacitance forming electrodes 21α and 21β, which are both constituted by the second metal films 26, with the interlayer insulating film 27 being interposed between the shield electrode 35 and the first and second capacitance forming electrodes 21α and 21β. The shield electrode 35, on the other hand, is located at a lower layer side relative to the first and second pixel electrodes 19α and 19β, which are both constituted by the transparent electrode films 30, with the planarization film 29 being interposed between the shield electrode 35 and the first and second pixel electrodes 19α and 19β. That is, the shield electrode 35 is positioned in the middle between the first capacitance forming electrode 21α and the second capacitance forming electrode 21β at the lower layer side and the first pixel electrode 19α and the second pixel electrode 19β at the upper layer side. According to such a configuration, compared with a case in which the shield electrode is disposed in a layer at an opposite side of, that is, at a lower layer side of, the first pixel electrode 19α and the second pixel electrode 19β with respect to the first capacitance forming electrode 21α and the second capacitance forming electrode 21β, an electric field that can occur between the second pixel electrode 19β and the first capacitance forming electrode 21α and an electric field that can occur between the first pixel electrode 19α and the second capacitance forming electrode 21β can be more favorably shielded by the shield electrode 35 positioned in the middle. This makes the potentials of the first pixel electrode 19α and the second pixel electrode 19β less likely to vary. Also, since the third metal film 28 that constitutes the shield electrode 35 also constitutes the second source-wire constituent portion 17B that constitutes the source wire 17 and the second connection-wire constituent portion 22B that constitutes the connection wire 22, the number of films can be reduced compared with a case in which a metal film for constituting the shield electrode is provided separately from the third metal film 28.

As illustrated in FIGS. 12 and 13, an end portion 35a of the shield electrode 35, the end portion 35a being located at a portion that overlaps the first capacitance forming electrode 21α and being adjacent to the second pixel electrode 19β in the Y-axis direction, extends more toward the second pixel electrode 19β in the Y-axis direction than an end portion 21α1 of the first capacitance forming electrode 21α, the end portion 21α1 being adjacent to the second pixel electrode 19β in the Y-axis direction. According to such a configuration, the end portion 35a of the shield electrode 35, the end portion 35a being adjacent to the second pixel electrode 19β in the Y-axis direction, covers the end portion 21α1 of the first capacitance forming electrode 21α, the end portion 21α1 being adjacent to the second pixel electrode 19β in the Y-axis direction, from the upper layer side. Accordingly, an electric field that can occur between the end portion 21α1 of the first capacitance forming electrode 21α, the end portion 21α1 being adjacent to the second pixel electrode 19β in the Y-axis direction, and the second pixel electrode 19β is even more favorably shielded by the shield electrode 35. This makes the potential of the second pixel electrode 19β even less like to vary. An end portion 35b of the shield electrode 35, the end portion 35b being located at a portion that overlaps the first capacitance forming electrode 21α and being adjacent to the first pixel electrode 19α in the Y-axis direction, is disposed so as to withdraw more toward the second pixel electrode 19β in the Y-axis direction than an end portion 21α2 of the first capacitance forming electrode 21α, the end portion 21α2 being adjacent to the first pixel electrode 19α in the Y-axis direction. That is, the end portion 21α2 of the first capacitance forming electrode 21α, the end portion 21α2 being adjacent to the first pixel electrode 19α in the Y-axis direction, is not covered by the shield electrode 35. The spacer 34 provided on the counter substrate 11B is disposed at a position that overlaps the capacitance wire 20, the first capacitance forming electrode 21α, and the shield electrode 35.

Figure 14:
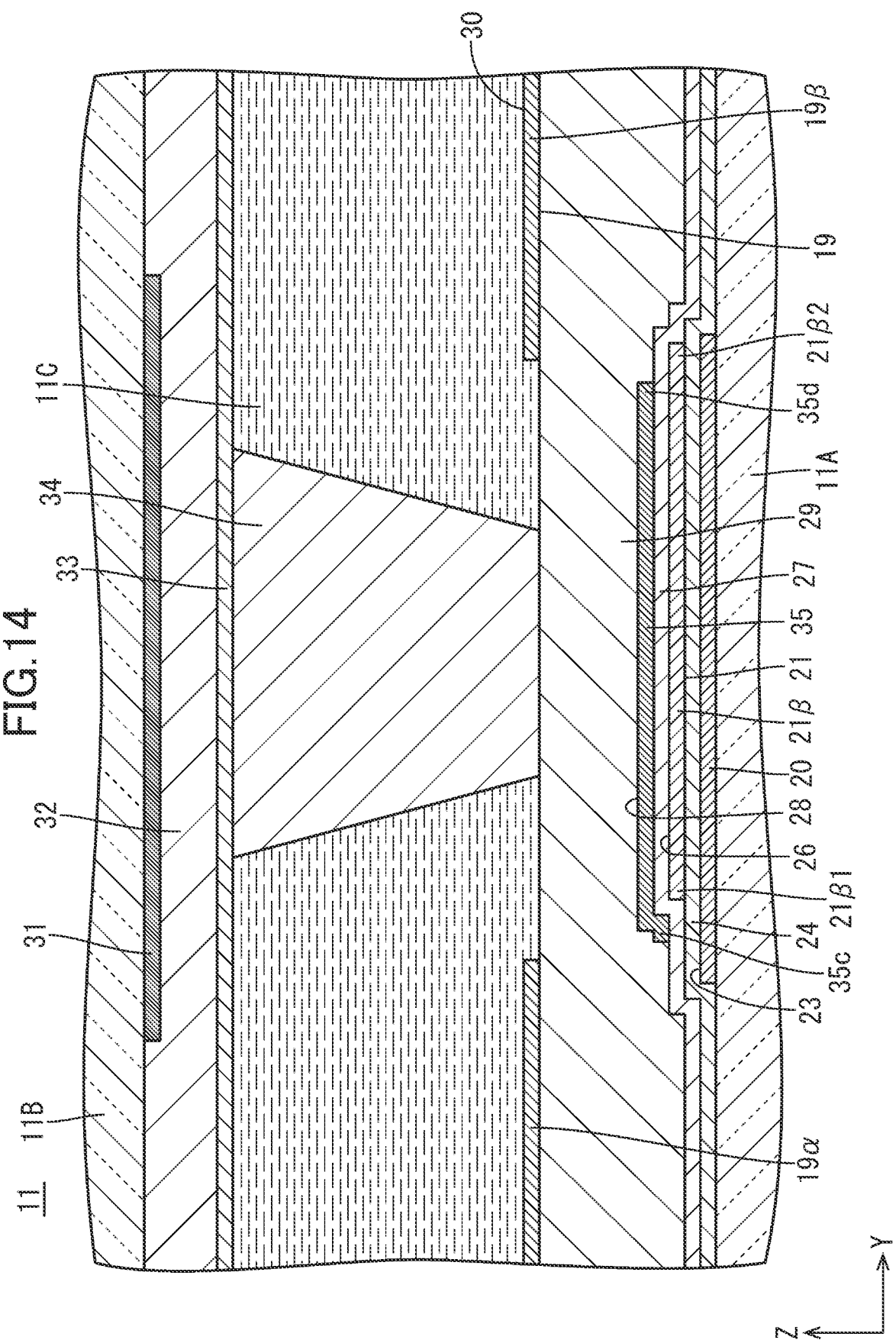
FIG. 14 is a sectional view of the liquid-crystal panel, taken along line D-D in FIG. 10.

FIG. 14 is a sectional view of the shield electrode 35, the second capacitance forming electrode 21β, and so on in the liquid-crystal panel 11 (a sectional view along line D-D in FIG. 10). As illustrated in FIGS. 12 and 14, an end portion 35c of the shield electrode 35, the end portion 35c being located at a portion that overlaps the second capacitance forming electrode 21β and being adjacent to the first pixel electrode 19α in the Y-axis direction, extends more toward the first pixel electrode 19α in the Y-axis direction than an end portion 21β1 of the second capacitance forming electrode 21β, the end portion 21β1 being adjacent to the first pixel electrode 19α in the Y-axis direction. According to such a configuration, the end portion 35c of the shield electrode 35, the end portion 35c being adjacent to the first pixel electrode 19α in the Y-axis direction, covers the end portion 21β1 of the second capacitance forming electrode 21β, the end portion 21β1 being adjacent to the first pixel electrode 19α in the Y-axis direction, from the upper layer side. Accordingly, an electric field that can occur between the end portion 21β1 of the second capacitance forming electrode 21β, the end portion 21β1 being adjacent to the first pixel electrode 19α in the Y-axis direction, and the first pixel electrode 19α is even more favorably shielded by the shield electrode 35. This makes the potential of the first pixel electrode 19α even less likely to vary immediately after charging of image signals is started on the first pixel electrode 19α. Also, in a display device in which a direction in which a scan signal is sequentially input to the gate wires 16 can be switched (between a direction from the upper side to the lower side and a direction from the lower side to the upper side in FIGS. 5 and 6), a display quality decline is suppressed whichever direction is selected, which is favorable. An end portion 35d of the shield electrode 35, the end portion 35d being located at a portion that overlaps the second capacitance forming electrode 21β and being adjacent to the second pixel electrode 19β in the Y-axis direction, is disposed so as to withdraw more toward the first pixel electrode 19α in the Y-axis direction than an end portion 21β2 of the second capacitance forming electrode 21β, the end portion 21β2 being adjacent to the second pixel electrode 19β in the Y-axis direction. That is, the end portion 21β2 of the second capacitance forming electrode 21β, the end portion 21β2 being adjacent to the second pixel electrode 19β in the Y-axis direction, is not covered by the shield electrode 35. The spacer 34 provided on the counter substrate 11B is disposed at a position that overlaps the capacitance wire 20, the second capacitance forming electrode 21β, and the shield electrode 35.

Figure 15:
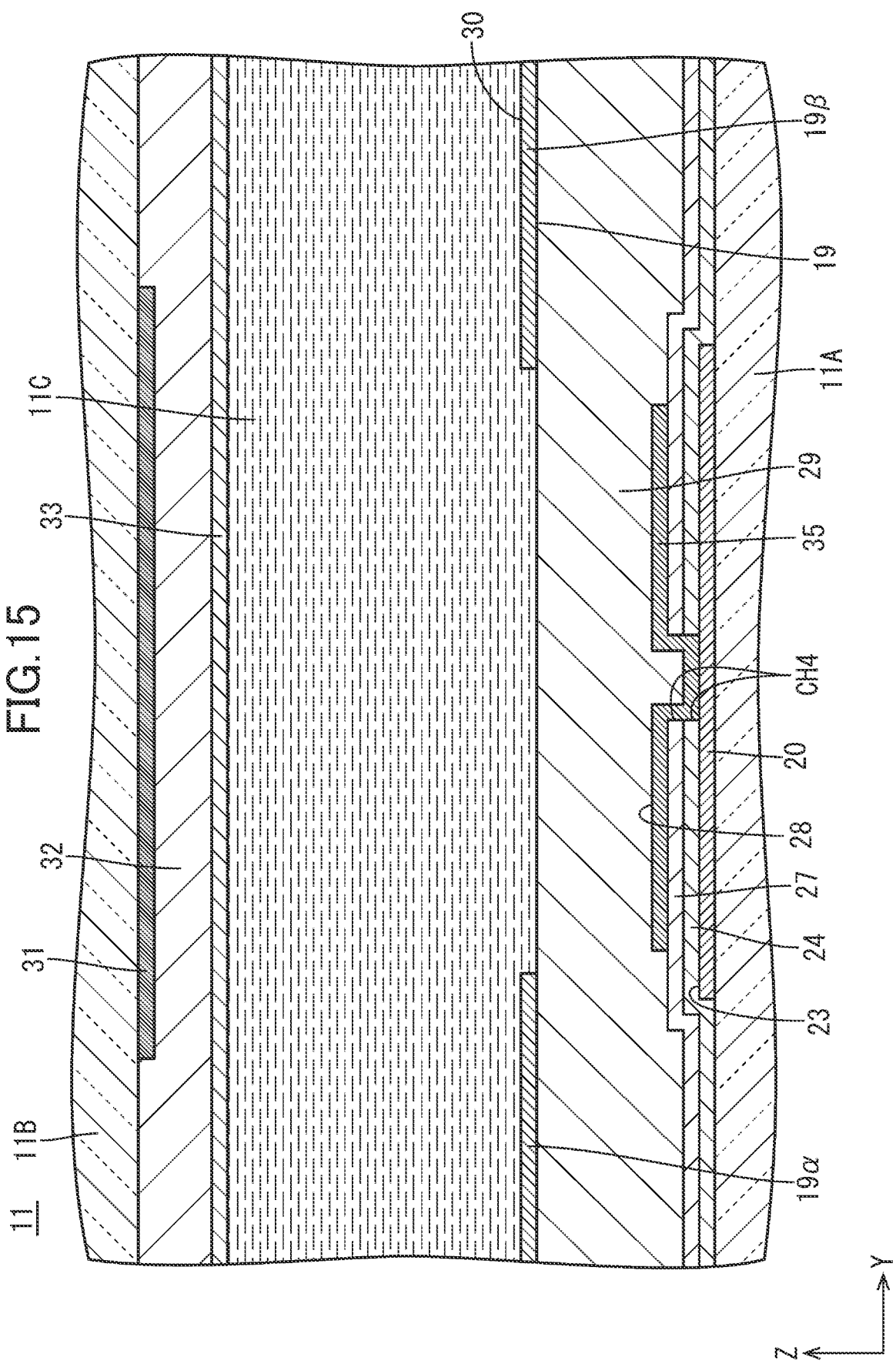
FIG. 15 is a sectional view of the liquid-crystal panel, taken along line F-F in FIG. 10.

FIG. 15 is a sectional view of a portion in the vicinity of a connection portion of the shield electrode 35 and the capacitance wire 20 in the liquid-crystal panel 11 (a sectional view along line E-E in FIG. 10). As illustrated in FIGS. 12 and 15, the shield electrode 35 is disposed so that its middle portion in the X-axis direction overlaps neither or the first capacitance forming electrode 21α and the second capacitance forming electrode 21β and overlaps the capacitance wire 20, constituted by the first metal film 23, without the second metal film 26 being interposed between the shield electrode 35 and the first and second capacitance forming electrodes 21α and 21β and with the gate insulating film 24 and the interlayer insulating film 27 being interposed therebetween. The shield electrode 35 is connected to the capacitance wire 20 through a capacitance-wire contact hole CH4 provided in the gate insulating film 24 and the interlayer insulating film 27 that are interposed between the middle portion of the shield electrode 35 in the X-axis direction and the capacitance wire 20. According to such a configuration, the shield electrode 35 connected to the capacitance wire 20 through the capacitance-wire contact hole CH4 provided in the gate insulating film 24 and the interlayer insulating film 27, which are interposed be the shield electrode 35 and the capacitance wire 20, is disposed so as to overlap the first capacitance forming electrode 21α, connected to the first pixel electrode 19α, via the interlayer insulating film 27, and is also disposed so as to overlap the second capacitance forming electrode 21β, connected to the second pixel electrode 19β, via the interlayer insulating film 27. Thus, both an electrostatic capacitance that is formed between the capacitance wire 20 and the shield electrode 35 and the first pixel electrode 19α and the first capacitance forming electrode 21α and an electrostatic capacitance that is formed between the capacitance wire 20 and the shield electrode 35 and the second pixel electrode 19β and the second capacitance forming electrode 21β become larger. Thus, the potentials of the first pixel electrode 19α and the second pixel electrode 19β are even more stably held.

As described above, the liquid-crystal display device 10 in the present embodiment includes the capacitance wire 20, the first pixel electrode 19α disposed so as to be adjacent to the capacitance wire 20, the second pixel electrode 19β disposed so that the capacitance wire 20 is located between the first pixel electrode 19α and the second pixel electrode 19β, the first capacitance forming electrode 21α that is connected to the first pixel electrode 19α and that is disposed so as to overlap the capacitance wire 20 via the gate insulating film 24, and the shield electrode 35 that is disposed so as to be located between the first pixel electrode 19α and the second pixel electrode 19β and so as to at least partially overlap the first capacitance forming electrode 21α via the interlayer insulating film 27.

With this arrangement, since the electrostatic capacitance is formed between the first capacitance forming electrode 21α connected to the first pixel electrode 19α and the capacitance wire 20, the potential of the first pixel electrode 19α is adapted to be held. Meanwhile, when a parasitic capacitance occurs between the first capacitance forming electrode 21α and the second pixel electrode 19β that is not connected to the first capacitance forming electrode 21α, there is a possibility that the potential of the second pixel electrode 19β varies due to the parasitic capacitance. In this respect, since the shield electrode 35 disposed so as to be located between the first pixel electrode 19α and the second pixel electrode 19β and so as to at least partially overlaps the first capacitance forming electrode 21α via the interlayer insulating film 27, the electric field that can occur between the second pixel electrode 19β and the first capacitance forming electrode 21α is favorably shielded by the shield electrode 35. This makes the potential of the second pixel electrode 19β less likely to vary, thereby suppressing a display quality decline due to the parasitic capacitance that can occur between the second pixel electrode 19β and the first capacitance forming electrode 21α. Moreover, since the first capacitance forming electrode 21α and the shield electrode 35 are both arranged to overlap the capacitance wire 20, the overlapping area of the capacitance wire 20 and the first capacitance forming electrode 21α is sufficiently ensured, so that the potential of the first pixel electrode 19α is more stably held. Since the above-described arrangement makes the potentials of both the first pixel electrode 19α and the second pixel electrode 19β less likely to vary, a display quality decline is suppressed, which is favorable particularly in a case in which the charging time of each of the pixel electrodes 19α and 19β is reduced.

Also, the liquid-crystal display device 10 includes the second capacitance forming electrode 21β that is connected to the second pixel electrode 19β and that is disposed so as to overlap the capacitance wire 20 via the gate insulating film 24. The first capacitance forming electrode 21α and the second capacitance forming electrode 21β are disposed so as to overlap the same capacitance wire 20 via the gate insulating film 24, the capacitance wire 20 being located between the first pixel electrode 19α and the second pixel electrode 19β to which the first capacitance forming electrode 21α and the second capacitance forming electrode 21β are respectively connected. With this arrangement, since an electrostatic capacitance is formed between the second capacitance forming electrode 21β connected to the second pixel electrode 19β and the capacitance wire 20, the potential of the second pixel electrode 19β is adapted to be held. Since the second capacitance forming electrode 21β is disposed so as to overlap the capacitance wire 20 that the first capacitance forming electrode 21α also overlaps via the gate insulating film 24, this arrangement is favorable for reducing the number of capacitance wires 20 that are disposed, compared with a case in which the first capacitance forming electrode and the second capacitance forming electrode are disposed so as to overlap different capacitance wires.

The shield electrode 35 is also disposed so as to overlap both the first capacitance forming electrode 21α and the second capacitance forming electrode 21β via the interlayer insulating film 27, the first capacitance forming electrode 21α and the second capacitance forming electrode 21β being respectively connected to the first pixel electrode 19α and the second pixel electrode 19β that are disposed so that the capacitance wire 20 is located therebetween. With this arrangement, since the shield electrode 35 is disposed so as to overlap the second capacitance forming electrode 21β, in addition to the first capacitance forming electrode 21α, via the interlayer insulating film 27, the electric field that can occur between the first pixel electrode 19α and the second capacitance forming electrode 21β is favorably shielded by the shield electrode 35. This makes the potential of the first pixel electrode 19α less likely vary, thus suppressing a display quality decline due to the parasitic capacitance that can occur between the first pixel electrode 19α and the second capacitance forming electrode 21β. Moreover, since the second capacitance forming electrode 21β and the shield electrode 35 are both arranged to overlap the capacitance wire 20, the overlapping area of the capacitance wire 20 and the second capacitance forming electrode 21β is sufficiently ensured, so that the potential of the second pixel electrode 19β is more stably held.

Also, the shield electrode 35 is disposed in a layer interposed between the planarization film (an insulating film) 29 and the interlayer insulating film 27, the planarization film 29 being located between the shield electrode 35 and the first and second pixel electrodes 19α and 19β, and the interlayer insulating film 27 being located between the shield electrode 35 and the first and second capacitance forming electrodes 21α and 21β. With this arrangement, compared with a case in which the shield electrode is disposed in a layer at an opposite side of the first pixel electrode 19α and the second pixel electrode 19β with respect to the first capacitance forming electrode 21α and the second capacitance forming electrode 21β, an electric field that can occur between the second pixel electrode 19β and the first capacitance forming electrode 21α and an electric field that can occur between the first pixel electrode 19α and the second capacitance forming electrode 21β can be more favorably shielded by the shield electrode 35. This makes the potentials of the first pixel electrode 19α and the second pixel electrode 19β even less likely to vary.

Also, the end portion 35a of the shield electrode 35, the end portion 35a being adjacent to the second pixel electrode 19β, extends more toward the second pixel electrode 19β than the end portion 21α1 of the first capacitance forming electrode 21α, the end portion 21α being adjacent to the second pixel electrode 19β. With such an arrangement, the end portion 35a of the shield electrode 35, the end portion 35a being adjacent to the second pixel electrode 19β, covers the end portion 21α1 of the first capacitance forming electrode 21α, the end portion 21α1 being adjacent to the second pixel electrode 19β. Thus, an electric field that can occur between the end portion 21α1 of the first capacitance forming electrode 21α, the end portion 21α1 being adjacent to the second pixel electrode 19β, and the second pixel electrode 19β is even more favorably shielded by the shield electrode 35. This makes the potential of the second pixel electrode 14 even less likely to vary.

Also, the end portion 35c of the shield electrode 35, the end portion 35c being adjacent to the first pixel electrode 19α, extends toward the first pixel electrode 19α than the end portion 21β1 of the second capacitance forming electrode 21β, the end portion 21β1 being adjacent to the first pixel electrode 19α. With this arrangement, the end portion 35c of the shield electrode 35, the end portion 35c being adjacent to the first pixel electrode 19α, covers the end portion 21β1 of the second capacitance forming electrode 21β, the end portion 21β1 being adjacent to the first pixel electrode 19α. Thus, an electric field that can occur between the end portion 21β1 of the second capacitance forming electrode 21β, the end portion 21β1 being adjacent to the first pixel electrode 19α, and the first pixel electrode 19α is even more favorably shielded by the shield electrode 35. This makes the potential of the first pixel electrode 19α even less likely to vary.

Also, the shield electrode 35 is disposed so as to overlap the capacitance wire 20 via the gate insulating film 24 and the interlayer insulating film 27 and is connected to the capacitance wire 20 through the capacitance-wire contact hole CH4 provided in the gate insulating film 24 and the interlayer insulating film 27 that are interposed between the shield electrode 35 and the capacitance wire 20. With this arrangement, the shield electrode 35 connected to the capacitance wire 20 through the capacitance-wire contact hole CH4 provided in the gate insulating film 24 and the interlayer insulating film 27 that are interposed between the shield electrode 35 and the capacitance wire 20 is disposed so as to overlap the first capacitance forming electrode 21α, connected to the first pixel electrode 19α, via the interlayer insulating film 27. Thus, an electrostatic capacitance that is formed between the capacitance wire 20 and the shield electrode 35 and the first pixel electrode 19α and the first capacitance forming electrode 21α becomes larger. Thus, the potential of the first pixel electrode 19α is even more stably held.

Also, the liquid-crystal display device 10 includes the plurality of source wires (image wires) 17 through which image signals are respectively supplied to the first pixel electrode 19α and the second pixel electrode 19β. Each source wire 17 has the first source-wire constituent portion (a first image-wire constituent portion) 17A and the second source-wire constituent portion (a second image-wire constituent portion) 17B that is disposed so as to overlap the first source-wire constituent portion 17A via the interlayer insulating film 27 and that is connected to the first source-wire constituent portion 17A through the source-wire contact hole CH1 provided in the interlayer insulating film 27. The first capacitance forming electrode 21α is constituted by the same second metal film (an electrically conductive film) 26 as the film that constitutes the first source-wire constituent portion 17A, which is one of the first source-wire constituent portion 17A and the second source-wire constituent portion 17B, whereas the shield electrode 35 is constituted by the same third metal film (an electrically conductive film) 28 as the film that constitutes the second source-wire constituent portion 17B, which is the other of the first source-wire constituent portion 17A and the second source-wire constituent portion 17B. With this arrangement, the first pixel electrode 19α and the second pixel electrode 19β are adapted to be charged to potentials based on image signals supplied to the source wires 17 to which they are respectively connected. Since each source wire 17 has a laminated structure of the first source-wire constituent portion 17A and the second source-wire constituent portion 17B that are connected to each other, and thus, for example, even when one of the first source-wire constituent portion 17A and the second source-wire constituent portion 17B is disconnected, transmission of image signals can be continued through the other source-wire constituent portion, thus improving the redundancy. In addition, the first capacitance forming electrode 21α is constituted by the same second metal film 26 as the film that constitutes the first source-wire constituent portion 17A, which is one of the first source-wire constituent portion 17A and the second source-wire constituent portion 17B, and the shield electrode 35 is constituted by the same third metal film 28 as the film that constitutes the other second source-wire constituent portion 17B. Thus, compared with a case in which the first capacitance forming electrode and one of the first source-wire constituent portion and the second source-wire constituent portion are constituted by different metal films (electrically conductive films), and the shield electrode and the other source-wire constituent portion are constituted by different metal films (electrically conductive films), it is possible to reduce the number of films.

Also, a plurality of sets, each set including the capacitance wire 20, the first pixel electrode 19α, and the second pixel electrode 19β, are arrayed, and the liquid-crystal display device 10 includes: the first TFTs (first switching elements) 18α respectively connected to the respective first pixel electrodes 19α, the first source wires (first image wires) 17α that are connected to the first TFTs 18α and through which the first image signals are transmitted; the second TFTs (second switching elements) 18β connected to the respective second pixel electrodes 19β; the second source wires (second image wires) 17β that are connected to the second TFTs 18β and through which the second image signals are transmitted; and the gate wires (scan wires) 16 that extend so as to intersect the first source wires 17α and the second source wires 17β and through which scan signals are transmitted. Two or more gate wires 16 are disposed so as to be located between the first pixel electrode 19α and the second pixel electrode 19β that belong to different sets of the plurality of sets and that are adjacent to each other, and are connected to both the first TFT 18α and the second TFT 18β that are respectively connected to the first pixel electrode 19α and the second pixel electrode 19β. With this arrangement, when a scan signal is transmitted to the gate wire 16, the first TFT 18α and the second TFT 18β connected thereto are driven. When the first TFT 18α is driven, the first pixel electrode 19α is charged to a potential based on the first image signal transmitted through the first source wire 17α. When the second TFT 18β is driven, the second pixel electrode 19β is charged to a potential based on the second image signal transmitted through the second source wire 17β. Since the first pixel electrode 19α and the second pixel electrode 19β that belong to the different sets and that are adjacent to each other are adapted to be charged when a scan signal is transmitted through one gate wire 16, the number of gate wires 16 that are disposed can be reduced compared with a case in which different gate wires are connected to the first TFT and the second TFT. This makes it possible to increase the amount of charging time of the first pixel electrode 19α and the second pixel electrode 19β.

Also, the liquid-crystal display device 10 includes: the gate wire 16 that is disposed so as to be adjacent to the first pixel electrode 19α at an opposite side to the capacitance wire 20 and through which a scan signal is transmitted; the first source wire 17α that extends so as to intersect the gate wire 16 and through which the first image signal is transmitted; the first TFT 18α that is disposed at an intersection position of the gate wire 16 and the first source wire 17α and that is connected to the first pixel electrode 19α, the gate wire 16, and the first source wire 17α, wherein the first TFT 18α has the gate electrode (the first electrode) 18A connected to the gate wire 16, the source electrode (the second electrode) 18B connected to the first source wire 17α, the channel portion 18D that has one end connected to the source electrode 18B and that is disposed so as to overlap the gate electrode 18A via the gate insulating film 24, and the drain electrode (the third electrode) 18C connected to another end of the channel portion 18D; and the first connection wire 22α that is connected to the drain electrode 18C, that extends toward the capacitance wire 20 along the first source wire 17α, and that is connected to the first capacitance forming electrode 21α and the first pixel electrode 19α at a position that overlaps the capacitance wire 20. With this arrangement, when a scan signal transmitted to the gate wire 16 is supplied to the gate electrode 18A of the first TFT 18α, the first TFT 18α is driven. In response, the first image signal transmitted to the first source wire 17α is suppled from the source electrode 18B to the drain electrode 18C via the channel portion 18D. Since the first image signal supplied to the drain electrode 18C is supplied to the first capacitance forming electrode 21α and the first pixel electrode 19α through the first connection wire 22α, the first pixel electrode 19α is charged to a potential based on the first image signal, and also an electrostatic capacitance is formed between the first capacitance forming electrode 21α and the capacitance wire 20. The first image signal is supplied to the first capacitance forming electrode 21α through the first connection wire 22α, as described above, and thus, compared with a case in which the first image signal is supplied via the first pixel electrode, the wiring resistance decreases, so that the potential of the first capacitance forming electrode 21α is stabilized.

The first pixel electrode 19α and the second pixel electrode 19β each have the first side portion 19A, which lies alone the capacitance wire 20, and the second side portion 19B, which intersects the first side portion 19A and which has a length that is larger than or equal to the length of the first side portion 19A. With this arrangement, compared with a case in which the length of the first side portion is smaller than the length of the second side portion, a parasitic capacitance that can occur between the second pixel electrode 19β and the first capacitance forming electrode 21α and a parasitic capacitance that can occur between the second pixel electrode 19β the first pixel electrode 19α tend to become large. In this respect, since an electric field that can occur between the second pixel electrode 19β and the first capacitance forming, electrode 21α is favorably shielded by the shield electrode 35, a parasitic capacitance that can occur between the second pixel electrode 19β and the first capacitance forming electrode 21α and a parasitic capacitance that can occur between the second pixel electrode 19β and the first pixel electrode 19α are reduced, thereby effectively suppressing a decline in the display quality.

The liquid-crystal display device 10 includes: the liquid-crystal panel (a display panel) 11 having at least the capacitance wire 20, the first pixel electrode 19α, the second pixel electrode 19β, the first capacitance forming electrode 21α, and the shield electrode 35; the backlight device (a lighting device) 12 that supplies light for display to the liquid-crystal panel 11 and that has the red light source 12R for emitting red light, the green light source 12G for emitting green light, and the blue light source 12B for emitting blue light; the panel controller 13 that controls the liquid-crystal panel 11 so that at least the red-data writing period in which the first pixel electrode 19α and the second pixel electrode 19β are charged to have a red display gray scale, the green-data writing period in which the first pixel electrode 19α and the second pixel electrode 19α are charged to have a green display gray scale, and the blue-data writing period in which the first pixel electrode 19α and the second pixel electrode 19β are charged to have a blue display gray scale are included in one frame period as a plurality of data writing periods; and the backlight controller (the lighting controller) 14 that controls the backlight device 12 so that the red light source 12R is turned on, and the green light source 12G and the blue light source 12B are turned off in the red display period that is a period between the red-data writing period and the data writing period that is included in the plurality of data writing periods and that is not the red-data writing period, the green light source 12G is turned on, and the red light source 12R and the blue light source 12B are turned off in the green display period that is a period between the green-data writing period and the data writing period that is included in the plurality of data writing periods and that is not the green-data writing period, and the blue light source 12B is turned on, and the red light source 12R and the green light source 12G are turned off in the blue display period that is a period between the blue-data writing period and the data writing period that is included in the plurality of data writing periods and that is not the blue-data writing period. With this arrangement, in the red-data writing period included in one frame period, the panel controller 13 causes the first pixel electrode 19α and the second pixel electrode 19β to be charged to have a red display gray scale, and in the red display period between the red-data writing period and the data writing period other than the red-data writing period, the backlight controller 14 turns on the red light source 12R and turns off the green light source 12G and the blue light source 12B. In response, the red light emitted from the red light source 12R passes through the first pixel electrode 19α and the second pixel electrode 19β charged to have the red display gray scale, so that red display is performed on the liquid-crystal panel 11. In the green-data writing period included in one frame period, the panel controller 13 causes the first pixel electrode 19α and the second pixel electrode 19β to be charged to have a green display gray scale, and in the green display period between the green-data writing period and the data writing period other than the green-data writing period, the backlight controller 14 turns on the green light source 12G and turns off the red light source 12R and the blue light source 12B. In response, the green light emitted from the green light source 12G passes through the first pixel electrode 19α and the second pixel electrode 19β charged to have the green display gray scale by, so that green display is performed on the liquid-crystal panel 11. In the blue-data writing period included in one frame period, the panel controller 13 causes the first pixel electrode 19α and the second pixel electrode 19β to be charged to have a blue display gray scale, and in the blue display period between the blue-data writing period and the data writing period other than the blue-data writing period, the backlight controller 14 turns on the blue light source 12B and turns off the red light source 12R and the green light source 12G. In response, the blue light emitted from the blue light source 12B passes through the first pixel electrode 19α and the second pixel electrode 19β charged to have the blue display gray scale, so that blue display is performed on the liquid-crystal panel 11. When one frame period is divided into at least six periods, that is, the red-data writing period, the green-data writing period, the blue-data writing period, the red display period, the green display period, and the blue display period, as described above, the charging time of the first pixel electrode 19α and the second pixel electrode 19β is reduced, and thus, the potentials of the first pixel electrode 19α and the second pixel electrode 19β tend to become unstable. In this respect, since an electric field that can occur between the second pixel electrode 19β and the first capacitance forming electrode 21α is favorably shielded by the shield electrode 35, the potential of the second pixel electrode 19β becomes less likely to vary, and also since the first capacitance forming electrode 21α and the shield electrode 35 are both arranged to overlap the capacitance wire 20, the potential of the first pixel electrode 19α is stably held. Thus, even when the charging time of the first pixel electrode 19α and the second pixel electrode 19β decreases, a decline in the display quality is effectively suppressed.

Second Embodiment

A second embodiment will now be described with reference to FIGS. 16 to 19. In the second embodiment, a description will be given of a configuration obtained by adding a second shield electrode 36. Redundant descriptions as to structures, effects, and advantages that are analogous to those in the first embodiment described above are not given hereinafter.

Figure 16:
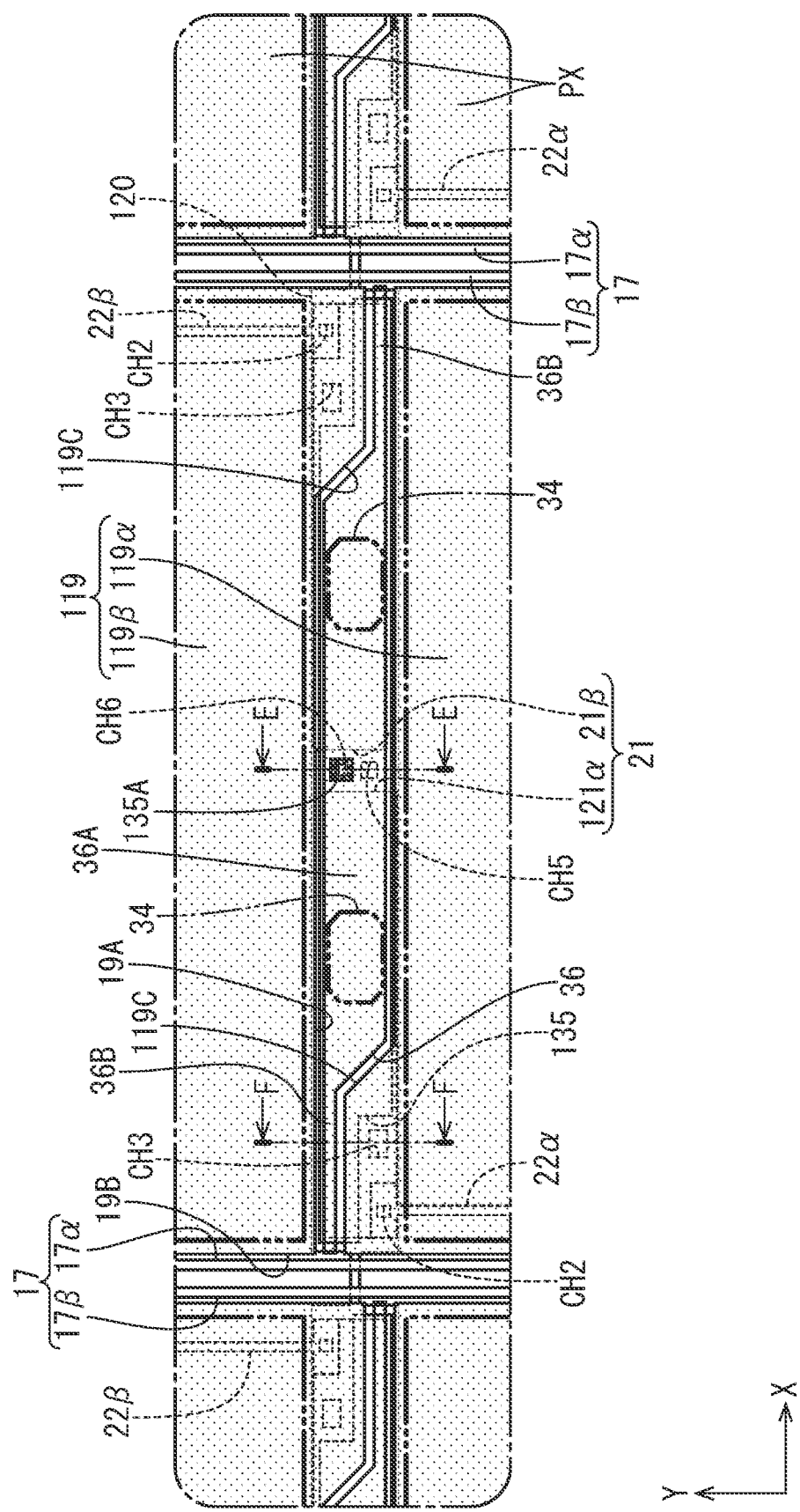
FIG. 16 is a plan view mainly illustrating a pattern of a transparent electrode film in a configuration in the vicinity of a capacitance wire in a liquid-crystal panel according to a second embodiment.
Figure 17:
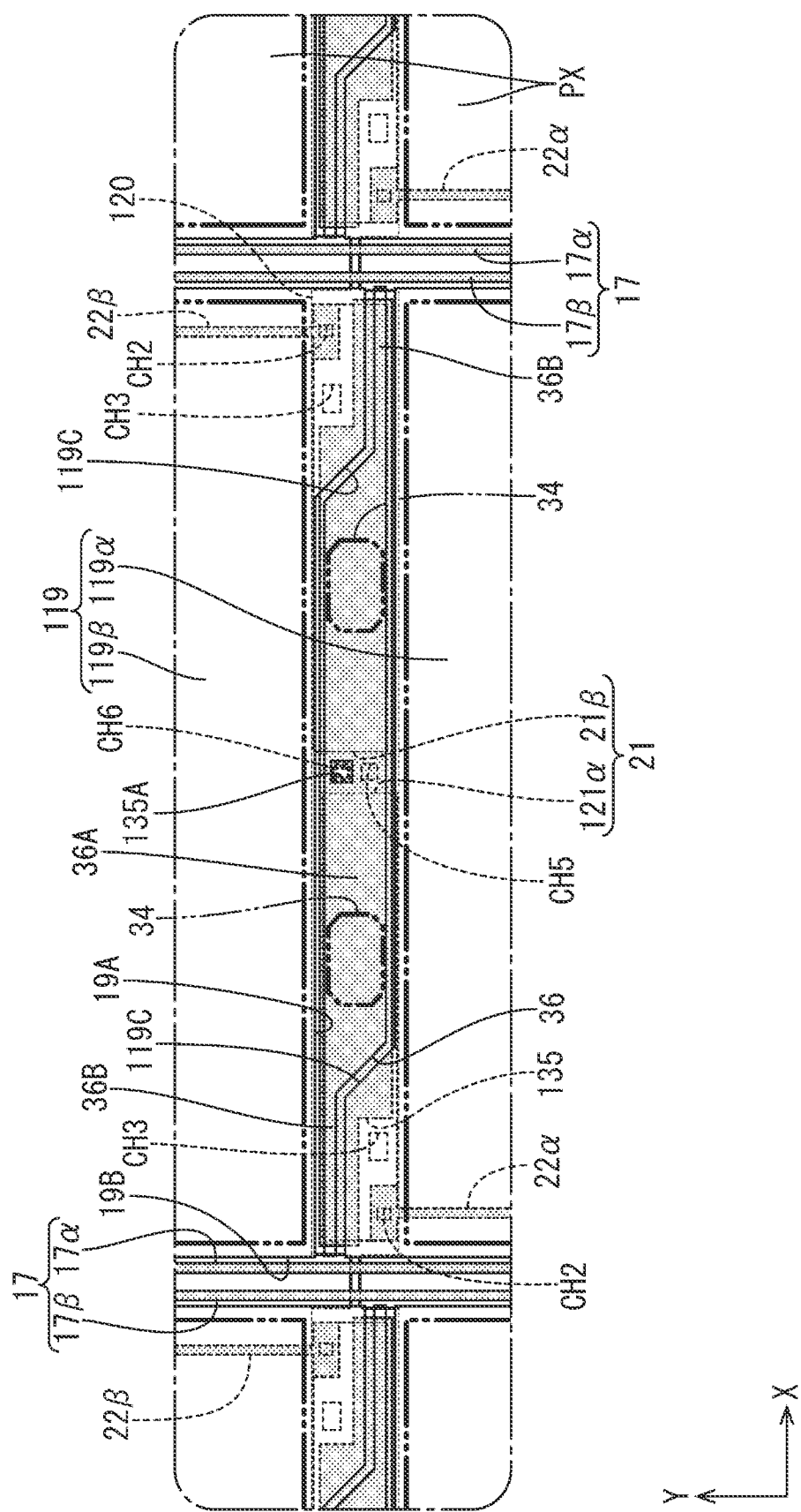
FIG. 17 is a plan view mainly illustrating a pattern of a third metal film in a configuration in the vicinity of the capacitance wire in the liquid-crystal panel.

In the present embodiment, as illustrated in FIGS. 16 and 17, the second shield electrode 36 is provided that is connected to a shield electrode 135 and that is disposed so as to overlap the shield electrode 135. FIG. 16 is an enlarged plan view of a portion in the vicinity of a capacitance wire 120 in the liquid-crystal pane 111 and illustrates the formation range of a transparent electrode film 130 by hatching. FIG. 17 is an enlarged plan view of a portion in the vicinity of the capacitance wire 120 in the liquid-crystal panel 111 and illustrates the formation range of a third metal film 128 by hatching. The second shield electrode 36 is constituted by the same transparent electrode film 130 as a film that constitutes a pixel electrode 119. Thus, the second shield electrode 36 is located between a first pixel electrode 119α and a second pixel electrode 119β that are adjacent to each other in the Y-axis direction and is also disposed a predetermined distance away therefrom, to thereby maintain the state of insulation against the pixel electrodes 119. The second shield electrode 36 has a horizontally long, generally belt-like shape that extends along the X-axis direction. A middle portion of the second shield electrode 36 is a large-width portion 36A, and two opposite end portions of the second shield electrode 36 are small-width portions 36B. One of the small-width portions 36B is interposed between the second pixel electrode 119β and an extension portion 119C of the first pixel electrode 119α in the Y-axis direction, the other small-width portion 36B is interposed between the first pixel electrode 119α and an extension portion 119C of the second pixel electrode 114 in the Y-axis direction. Most parts of the second shield electrode 36 are arranged to overlap the shield electrode 135.

Figure 18:
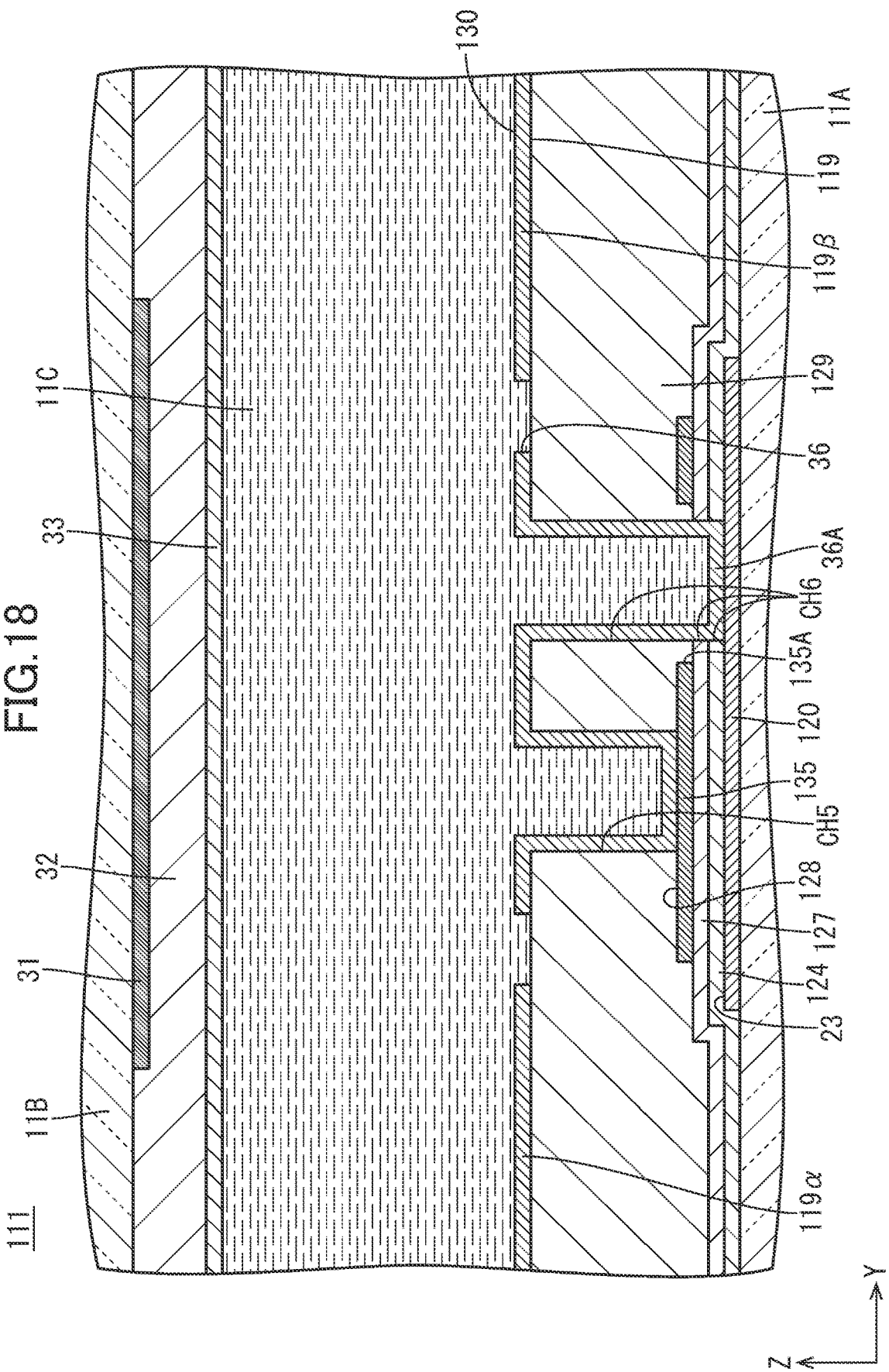
FIG. 18 is a sectional view of the liquid-crystal panel, taken along line F-F in FIG. 16.
Figure 19:
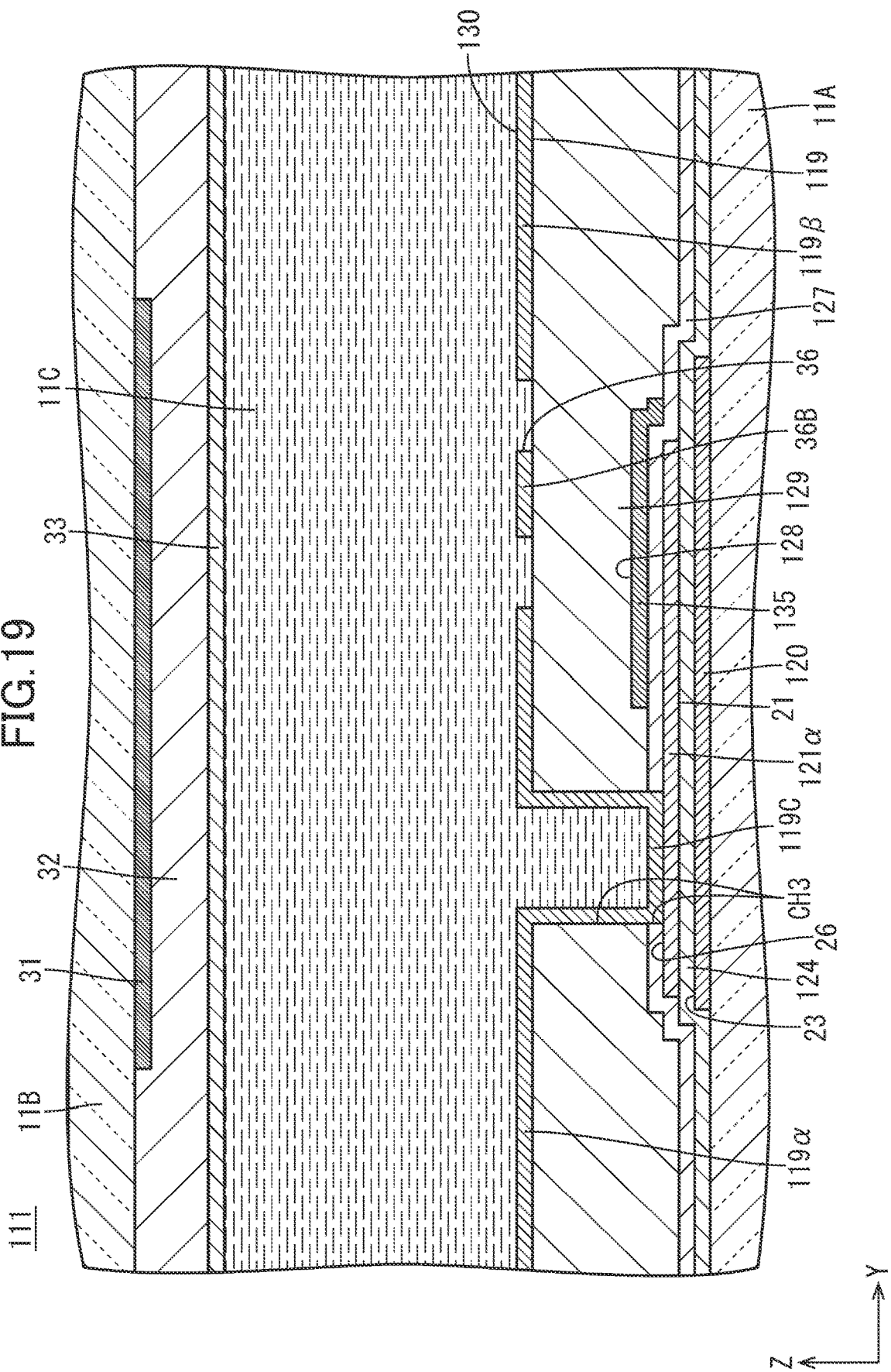
FIG. 19 is a sectional view of the liquid-crystal panel, taken along line F-F in FIG. 16.

The second shield electrode 36 constituted by the transparent electrode film 130 disposed at an upper layer side relative to the shield electrode 135 so as overlap it via a planarization film (an insulating film) 129, as illustrated in FIGS. 18 and 19. FIG. 18 is a sectional view of a portion in the vicinity of a connection portion of the second shield electrode 36 and the shield electrode 135 in the liquid-crystal panel 111 (a sectional view along line E-E in FIG. 16). FIG. 19 is a sectional view of a portion in the vicinity of a connection portion of the first pixel electrode 119α and a first capacitance forming electrode 121α in the liquid-crystal panel 111 (a sectional view along Line F-F in FIG. 16). The second shield electrode 36 is connected to the shield electrode 135 through a shield-electrode contact hole CH5 provided in the planarization film 129 interposed between the second shield electrode 36 and the shield electrode 135. In addition, the second shield electrode 36 is disposed so that the middle portion (the large-width portion 36A) thereof in the X-axis direction overlaps the capacitance wire 120 via a gate insulating film 124, an interlayer insulating film 127, and the planarization film 129 and is also connected to the capacitance wire 120 through a second capacitance-wire contact hole CH6 provided in the gate insulating film 124, the interlayer insulating film 127, and the planarization film 129. The shield electrode 135 has an opening portion 135A for passing the portion where the second shield electrode 36 is connected to the capacitance wire 120, the opening portion 135A being formed at a position that overlaps the second capacitance-wire contact hole CH6.

Since the second shield electrode 36 is connected to the shield electrode 135 through the shield-electrode contact hole CH5, as described above and illustrated in FIGS. 18 and 19, the second shield electrode 36 is maintained at the same potential as that of the shield electrode 135. In addition, since the second shield electrode 36 is connected to the capacitance wire 120, the capacitance wire 120, the shield electrode 135, and the second shield electrode 36 are all maintained at the same potential. The shield electrode 135 can be said to be connected to the capacitance wire 120 via the second shield electrode 36. That is, the second shield electrode 36 also has a function for connecting the shield electrode 135 to the capacitance wire 120. In addition, since the second shield electrode 36 is located between the first pixel electrode 119α and the second pixel electrode 119β n the Y-axis direction, an electric field that can occur between the first pixel electrode 119α and the second pixel electrode 119β can be shielded. In particular, although each of a gap between the second pixel electrode 119β and the extension portion 119C of the first pixel electrode 119α and a gap between the first electrode 119α and the extension portion 119C of the second pixel electrode 119β is small, the second shield electrode 36 is disposed in the gaps, as illustrated in FIGS. 16 and 19, and thus an electrjc field that can occur between the first pixel electrode 119α and the second pixel electrode 119β can be effectively shielded. This makes the potentials of the first pixel electrode 119α and the second pixel electrode 119β even less likely to vary. Also, since the shield electrode 135 connected to the capacitance wire 120 via the second shield electrode 36 is disposed so as to overlap the first capacitance forming electrode 121α, connected to the first pixel electrode 119α, via the interlayer insulating film 127, as illustrated in FIG. 19, an electrostatic capacitance that is formed between the capacitance wire 120, the shield electrode 135, and the second shield electrode 36 and the first pixel electrode 119α and the first capacitance forming electrode 121α becomes larger. Thus, the potential of the first pixel electrode 119α is even more stably held.

According to the present embodiment, the shield electrode 135 is disposed in a layer interposed between the planarization film (an insulating film) 129 and the interlayer insulating film 127, the planarization film 129 being located between the shield electrode 135 and the second pixel electrode 119β, and the interlayer insulating film 127 being located between the shield electrode 135 and the first capacitance forming electrode 121α. The liquid-crystal display device 10 includes the second shield electrode 36 that is constituted by the same transparent electrode film (an electrically conductive film) 130 as the film that constitutes the second pixel electrode 119β, that is disposed so as to overlap the shield electrode 135 via the planarization film (an insulating film) 129, and that is connected to the shield electrode 135 through the shield-electrode contact hole CH5 provided in the planarization film (an insulating film) 129 interposed between the second shield electrode 36 and the shield electrode 135. With this arrangement, compared with a case in which the shield electrode is disposed in a layer at an opposite side of the second pixel electrode 119β with respect to the first capacitance forming electrode 121α, an electric field that can occur between the first capacitance forming electrode 121α and the second pixel electrode 119β can be more favorably shielded by the shield electrode 135. This makes the potential of the second pixel electrode 119β even less likely to vary. Since the second shield electrode 36 is connected to the shield electrode 135 through the shield-electrode contact hole CH5 provided in the planarization film 129 interposed between the second shield electrode 36 and the shield electrode 135, the second shield electrode 36 is maintained at the same potential as that of the shield electrode 135. In addition, since the second shield electrode 36 is located between the first pixel electrode 119α and the second pixel electrode 119β, an electric field that can occur between the first pixel electrode 119α and the second pixel electrode 119β can be shielded. This makes the potential of the second pixel electrode 119β even less likely to vary.

Also, the second shield electrode 36 is connected to the capacitance wire 120 through the second capacitance-wire contact hole CH6, provided in the interlayer insulating film 127 and the planarization film (an insulating film) 129, and the gate insulating film 124, which is interposed between the second shield electrode 36 and the capacitance wire 120. With this arrangement, the shield electrode 135 is connected to the capacitance wire 120 via the second shield electrode 36. That is, the second shield electrode 36 also has a function for connecting the shield electrode 135 to the capacitance wire 120. Since the shield electrode 135 connected to the capacitance wire 120 via the second shield electrode 36 is disposed so as to overlap the first capacitance forming electrode 121α, connected to the first pixel electrode 119α, via the interlayer insulating film 127, an electrostatic capacitance that is formed between the capacitance wire 120, the shield electrode 135, and the second shield electrode 36 and the first pixel electrode 119α and the first capacitance forming electrode 121α becomes larger. Thus, the potential of the first pixel electrode 119α is even more stably held.

Third Embodiment

A third embodiment will be described with reference to FIGS. 20 to 26. In the third embodiment, a description will be given of a structure in which the display mode of a liquid-crystal panel 211 is changed from the display mode in the first embodiment. Redundant descriptions as to structures, effects, and advantages that are analogous to those in the first embodiment described above are not given hereinafter.

Figure 20:
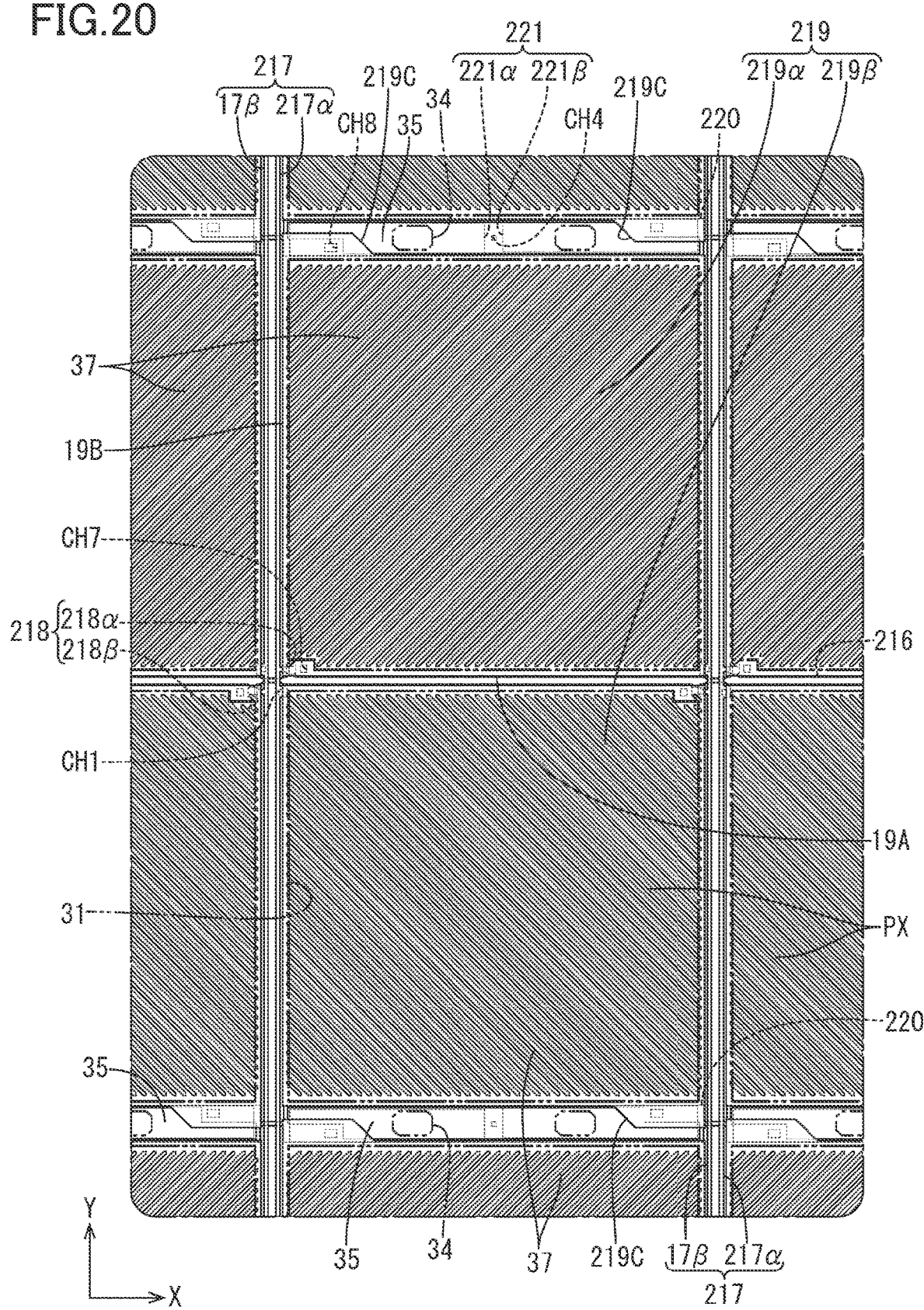
FIG. 20 is an enlarged plan view of an array of pixels in a liquid-crystal panel according to a third embodiment.
Figure 24:
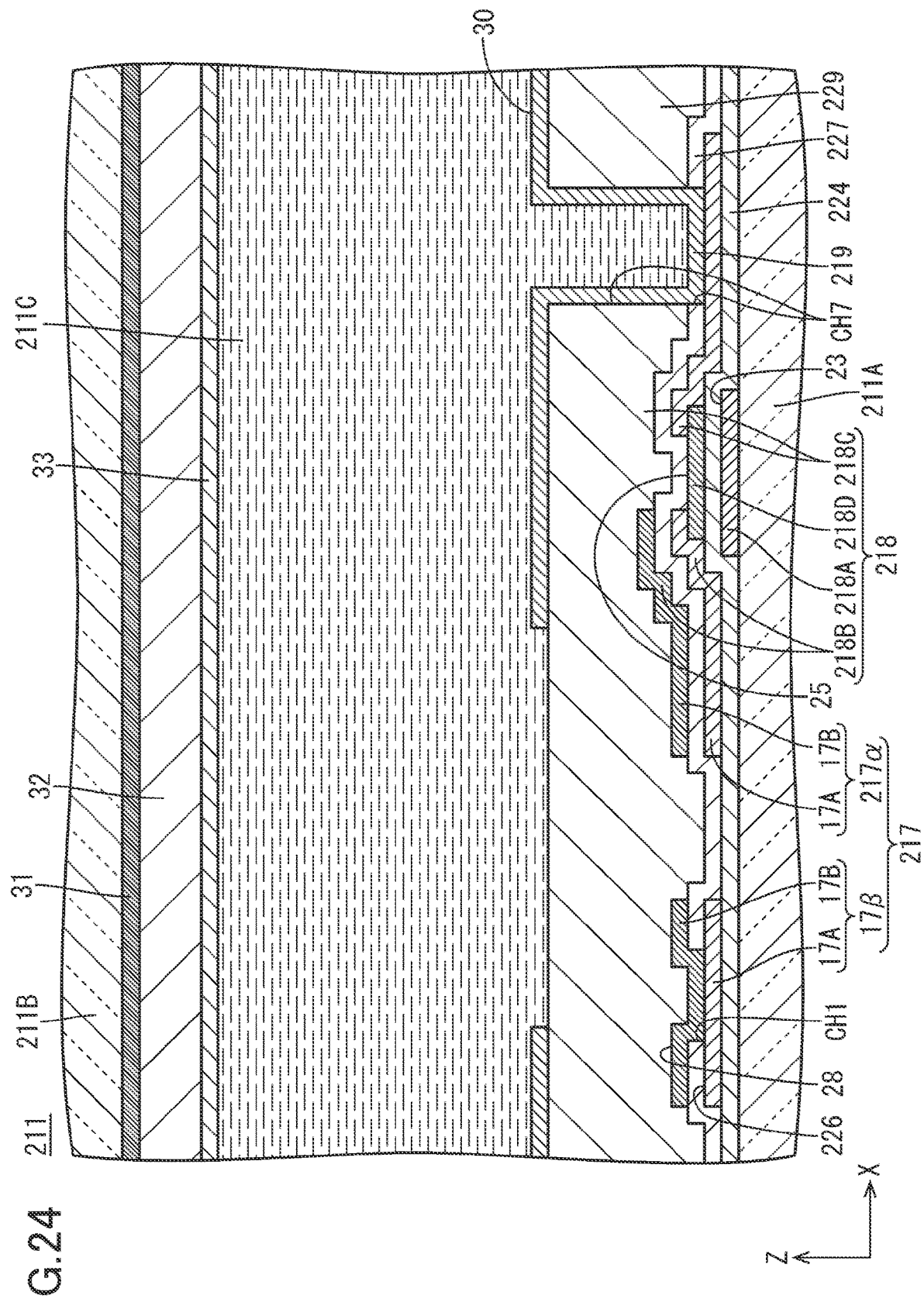
FIG. 24 is a sectional view of the liquid-crystal panel, taken along line A-A in FIG. 23.

The display mode of the liquid-crystal panel 211 according to the present embodiment is assumed to be a vertical alignment (VA) mode (see FIG. 24). Correspondingly, both alignment films in the liquid-crystal panel 211 are vertical alignment films that cause the longitudinal arcs of liquid-crystal molecules included in a liquid-crystal layer 211C to be aligned generally orthogonal to the film surface of the substrate when no voltage is applied to the liquid-crystal layer 211C. Also, a negative liquid-crystal material having negative dielectric constant anisotropy is used as a liquid-crystal material included in the liquid-crystal layer 211C. A plurality of slits 37 is provided in each pixel electrode 219, as illustrated in FIG. 20. FIG. 20 is an enlarged plan view of an array of pixels PX in the liquid-crystal panel 211. The slits 37 extend along an oblique direction tilted relative to the X-axis direction and the Y-axis direction and are arranged away from one another an oblique direction that is orthogonal to the extending direction of the slits 37 in a plane of the pixel electrode 219. A first pixel electrode 219α and a second pixel electrode 219β have a relationship that the extending directions of the slits 37 intersect each other.

Specifically, the extending direction of the sits 37 provided in the first pixel electrode 219α is obliquely upward to the right, as illustrated in FIG. 20, and the extending direction of the slits 37 provided in the second pixel electrode 219β is obliquely upward to the left, as illustrated in FIG. 20. Groove portions (portions where the pixel electrodes 219 are absent) are partially formed in portions that belong to a surface of an array substrate 211A, the surface being adjacent to the liquid-crystal layer 211C, and that overlap the slits 37, and thus electric fields corresponding to the shapes of the groove portions are formed. Thus, the liquid-crystal molecules included in the liquid-crystal layer 211C are adapted to be aligned along the groove portions.

Figure 21A:
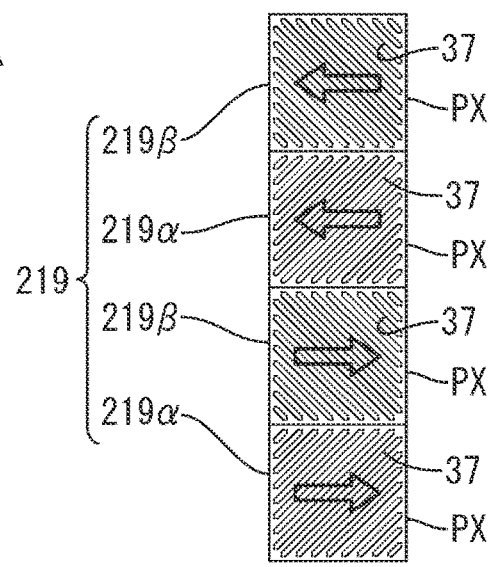
FIG. 21A is a diagram illustrating an alignment treatment on an alignment film of an array substrate.
Figure 21B:
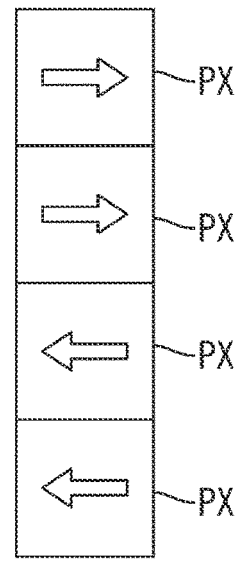
FIG. 21B is a diagram illustrating an alignment treatment on an alignment film of a counter substrate.
Figure 21C:
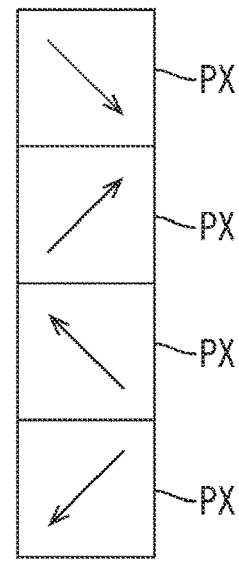
FIG. 21C is a diagram illustrating tilt directions of liquid-crystal molecules in the liquid-crystal panel.

Thus, in the present embodiment, a specific alignment treatment is adapted to be performed on the alignment films included in the liquid-crystal panel 211. The alignment films are uniformly provided in the respective innermost surfaces of a pair of the array substrate 211A and a counter substrate 211B that are included in the liquid-crystal panel 211. Now, the alignment treatment on the alignment films will be described in detail with reference to FIGS. 21A to 21C. FIG. 21A is a diagram illustrating an alignment treatment on the alignment film of the array substrate 211A, the diagram being obtained by viewing the array substrate 211A from the liquid-crystal layer 211C. FIG. 21B is a diagram illustrating an alignment treatment on the alignment film of the counter substrate 211B, the diagram being obtained by viewing the counter substrate 211B from an opposite side to the liquid-crystal layer 211C, that is, a side to which the polarizer is attached. FIG. 21C is a diagram illustrating tilt directions (alignment directions) of the liquid-crystal molecules in four pixels PX arranged in the liquid-crystal panel 211 in the Y-axis direction. FIG. 21C is a diagram viewed from the counter substrate 211B, with the array substrate 211A facing down and the counter substrate 211B facing up.

Specifically, the alignment films are optical alignment films that allow an alignment regulating force to be given to the liquid-crystal molecules when an optical alignment treatment is performed on surfaces of the alignment films, and the optical alignment treatment differs for each pair of the first pixel electrode 219α and the second pixel electrode 219β that are adjacent to each other across a capacitance wire 220. That is, as illustrated in FIG. 21A, in a manufacturing process, for the alignment film that is adjacent to the array substrate 211A, alignment treatment light (polarized ultraviolet) with which the first pixel electrode 219α and the second pixel electrode 219β (i.e., two pixel electrodes 219 at the upper side FIG. 21A) that are adjacent to each other across the odd-numbered capacitance wire 220 illuminated and alignment treatment light with which the first pixel electrode 219α and the second pixel electrode 219β (i.e., two pixel electrodes 219 at the lower side in FIG. 21A) that are adjacent to each other across the even-numbered capacitance wire 220 have orientations that are opposite to each other along the X-axis direction. In FIG. 21A, the illumination directions of the alignment treatment light are denoted by hollow arrows. In the present embodiment, the first pixel electrode 219α and the second pixel electrode 219β that are adjacent to each other across the odd-numbered capacitance wire 220 are illuminated with leftward alignment treatment light by a light source arranged at the right side in FIG. 21A, and the first pixel electrode 219α and the second pixel electrode 219β that are adjacent to each other across the even-numbered capacitance wire 220 are illuminated with rightward alignment treatment light from a light source arranged at the left side in FIG. 21A. During illumination of the alignment treatment light that are oriented opposite to each other in orientation, a mask is used so that unnecessary portions are not illuminated with the alignment treatment light. On the other hand, as illustrated in FIG. 21B, in the manufacturing process, for the alignment film that is adjacent to the counter substrate 211B, alignment treatment light with which in two pixels PX that are adjacent to each other across the odd-numbered capacitance wire 220 (i.e., two pixels PX at the upper side in FIG. 21B) is illuminated and alignment treatment light with which two pixels PX that are adjacent to each other across the even-numbered capacitance wire 220 (i.e., two pixels PX at the lower side in FIG. 21B) is illuminated have orientations that are opposite to each other along the X-axis direction. In FIG. 21B, the illumination directions of the alignment treatment light are denoted by hollow arrows. In the present embodiment, two pixels PX that are adjacent to each other across the odd-numbered capacitance wire 220 are illuminated with rightward alignment treatment light from the light source arranged at the left side in FIG. 21B, that is, alignment treatment light that differs in orientation by 180° from alignment treatment light for the pixels PX that are adjacent to the array substrate 211A, whereas two pixels PX that are adjacent to each other across the even-numbered capacitance wire 220 are illuminated with leftward alignment treatment light from the light source arranged at the right side in FIG. 21B, that is, alignment treatment light that differs in orientation by 180° from alignment treatment light for the pixels PX that are adjacent to the array substrate 211A.

Owing to the pair of alignment films on which such an optical alignment treatment is performed, the tilt directions of the liquid-crystal molecules (the alignment directions; directions in which the liquid-crystal molecules are oriented when a voltage is applied to the liquid-crystal layer 211C) in four pixels PX that are arrayed along the Y-axis direction differ from one another, as illustrated in FIG. 21C. In FIG. 21C, the tilt directions of the liquid-crystal molecules in the vicinity of a middle portion of the liquid-crystal layer 211C in the thickness direction are denoted by solid-line arrows. More specifically, the tilt directions of the liquid-crystal molecules in four pixels PX arrayed in the Y-axis direction are set so as to differ from one another by an integer multiple of 90 degrees. That is, in the uppermost pixel PX (the second pixel electrode 219β that is adjacent to the odd-numbered capacitance wire 220) in FIG. 21C, the tilt direction of the liquid-crystal molecules is obliquely downward to the right and is parallel to the extending direction of the slits 37 provided in the second pixel electrode 219β included in the pixel PX. In the second pixel PX (the first pixel electrode 219α that is adjacent to the odd-numbered capacitance wire 220) from the top in FIG. 21C, the tilt direction of the liquid-crystal molecules is obliquely upward to the right and is parallel to the extending direction of the slits 37 provided in the first pixel electrode 219α included in the pixel PX. In the third pixel PX (the second pixel electrode 219β that is adjacent to the even-numbered capacitance wire 220) from the top in FIG. 21C, the tilt direction of the liquid-crystal molecules is obliquely upward to the left and is parallel to the extending direction of the slits 37 provided in the second pixel electrode 219β included in the pixel PX. In the bottommost pixel PX (the first pixel electrode 219α that is adjacent to the even-numbered capacitance wire 220) in FIG. 21C, the tilt direction of the liquid-crystal molecules is obliquely downward to the left and is parallel to the extending direction of the slits 37 provided in the first pixel electrode 219α included in the pixel PX. Since the liquid-crystal molecules included in the four pixels PX arrayed along the Y-axis direction are aligned and regulated in mutually different directions by the slits 37 in the pixel electrodes 219 and the pair of alignment films, as described above, viewing-angle characteristics for an image displayed on the liquid-crystal panel 211 are equalized to thereby provide favorable display performance.

Figure 22:
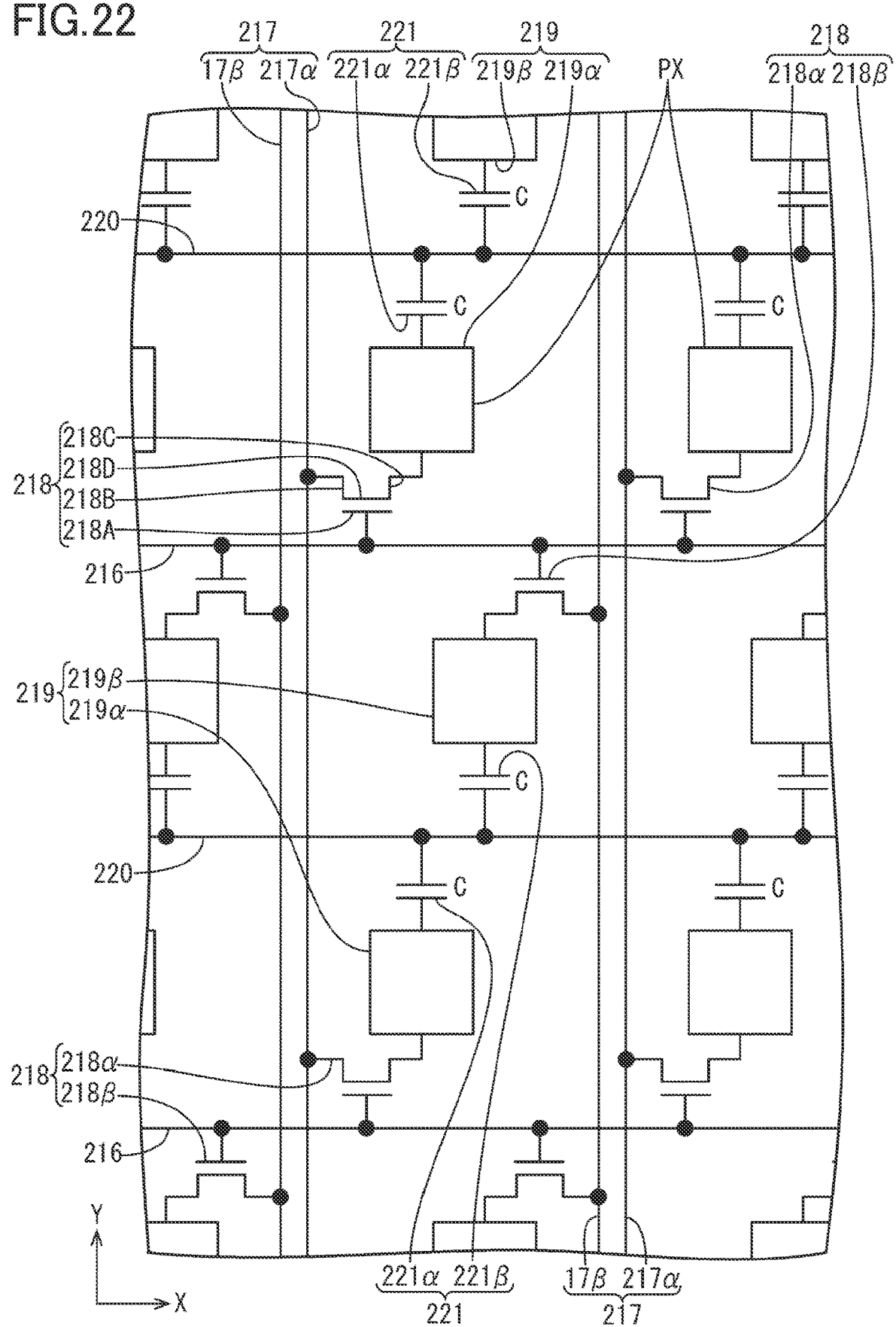
FIG. 22 is a circuit diagram illustrating the array of pixels in the liquid-crystal panel.
Figure 23:
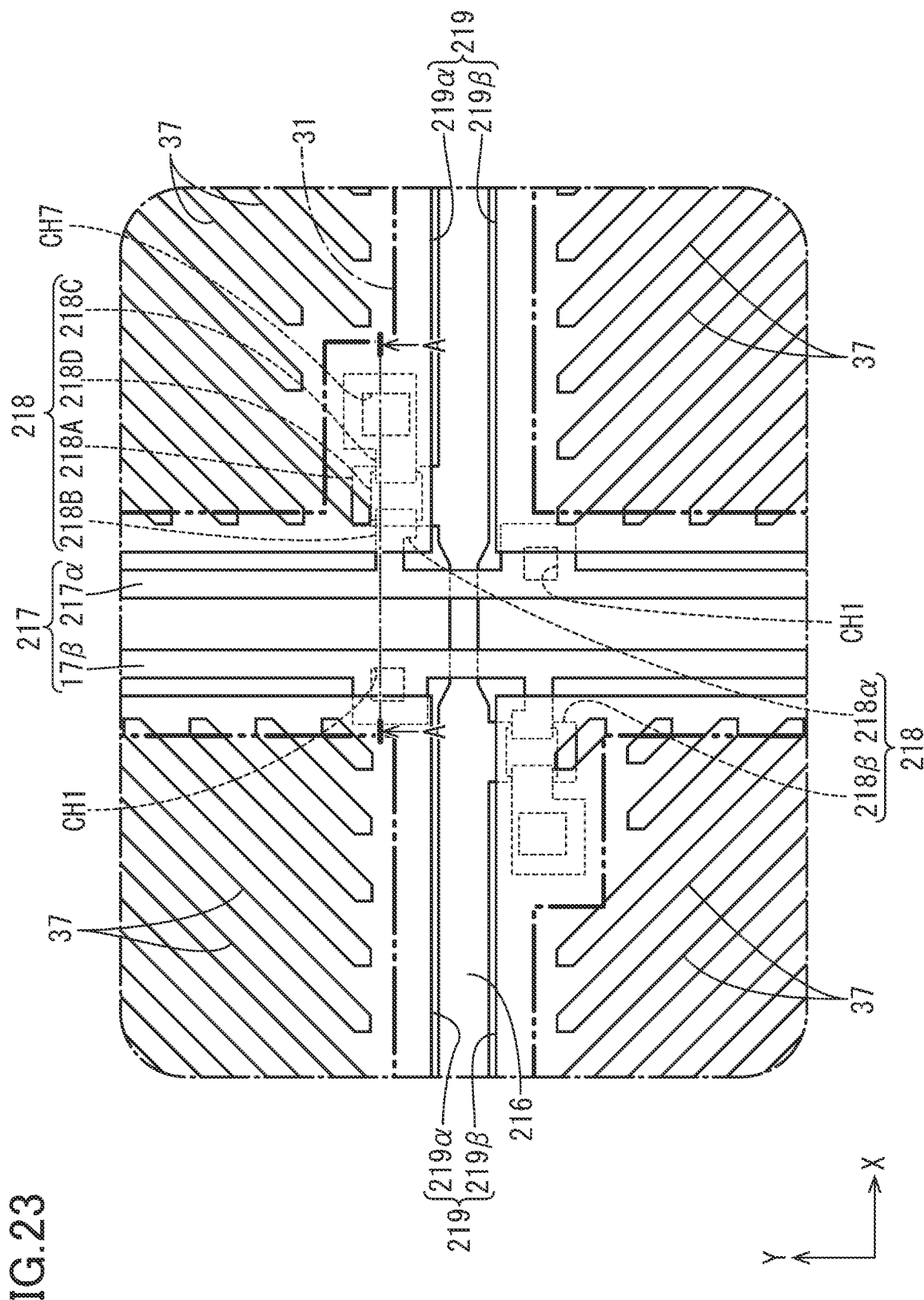
FIG. 23 is an enlarged plan view of a portion in the vicinity of TFTs in the liquid-crystal panel.
Figure 25:
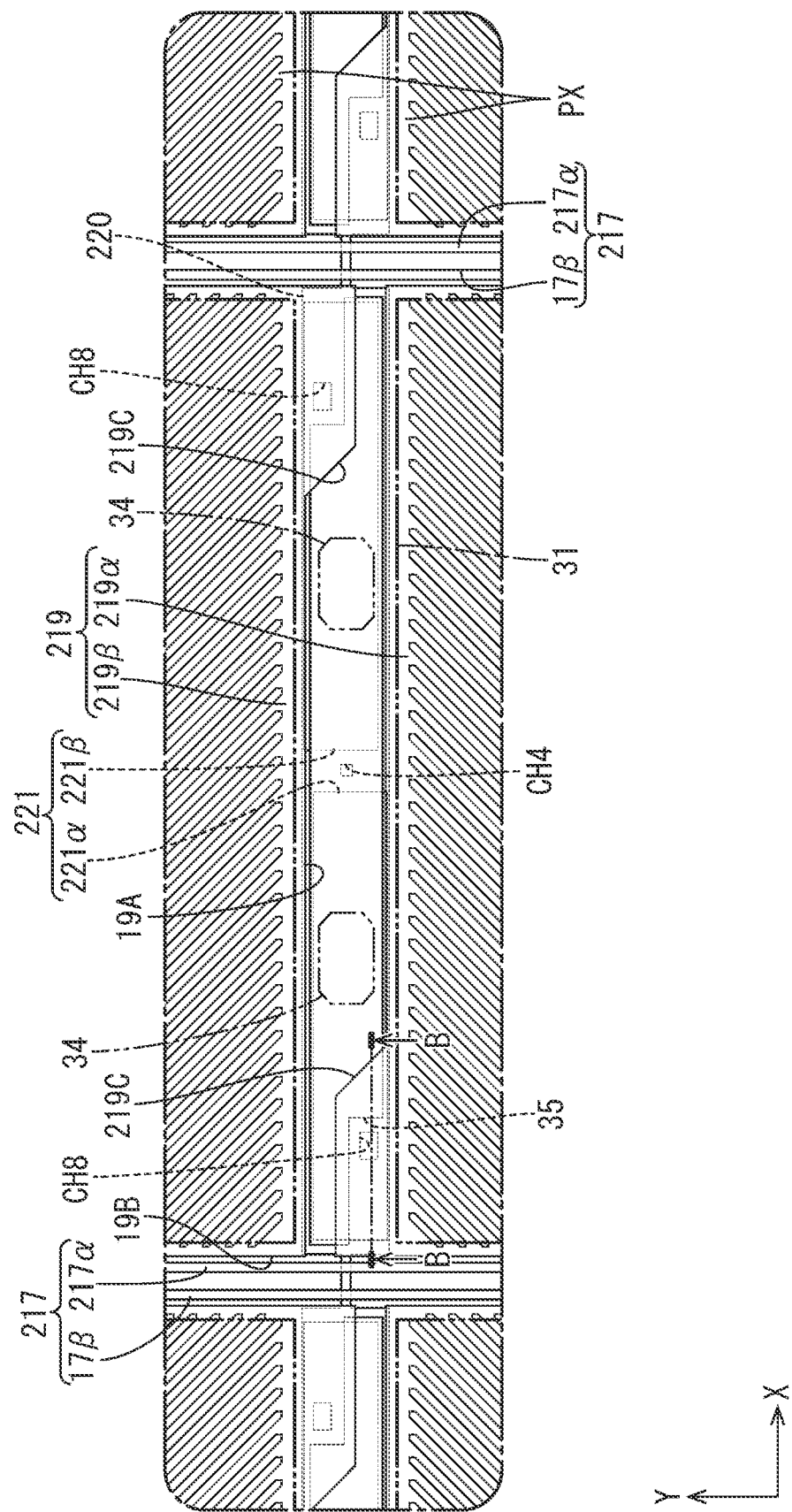
FIG. 25 is an enlarged plan view of a portion in the vicinity of a capacitance wire in the liquid-crystal panel.
Figure 26:
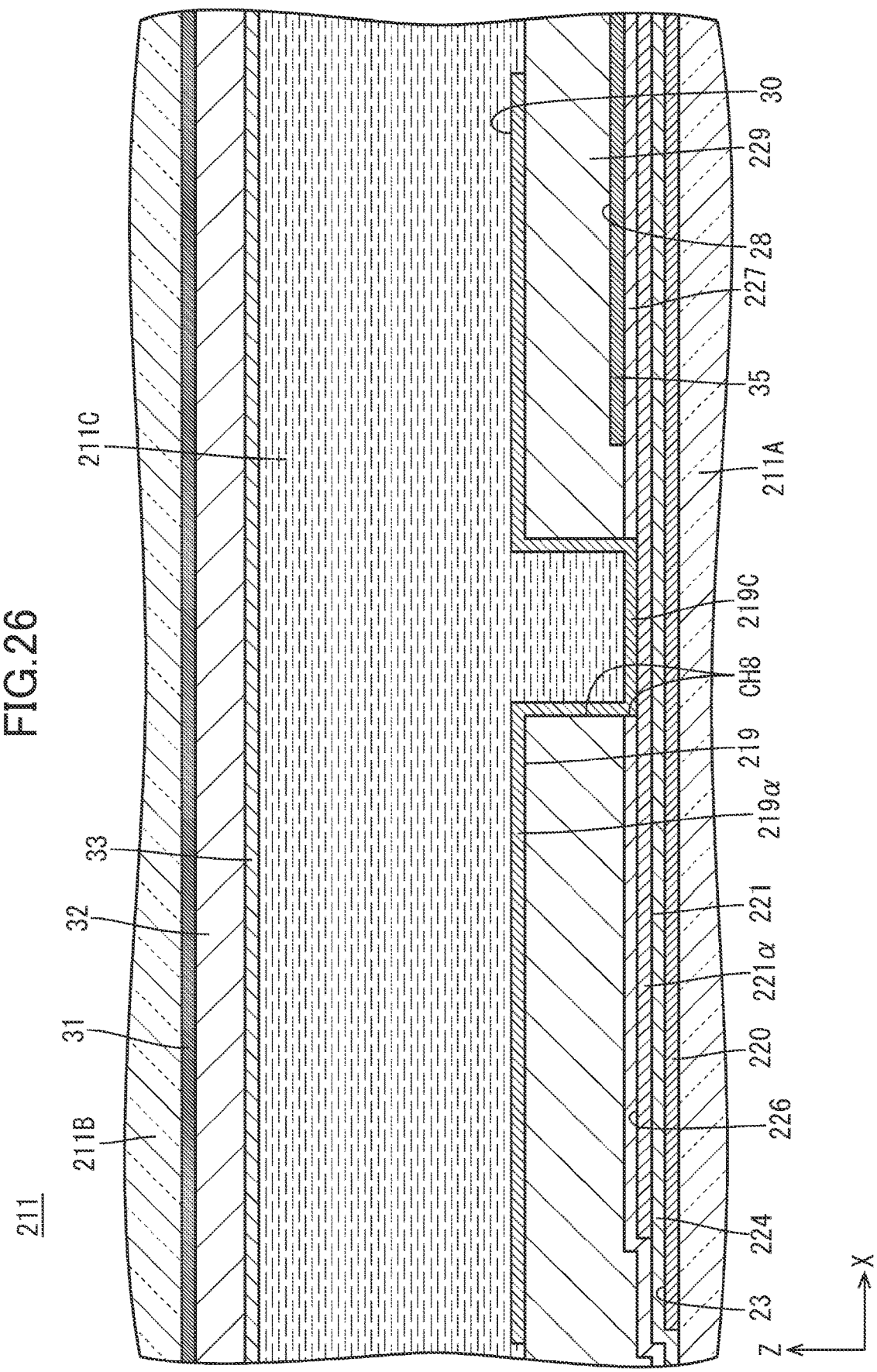
FIG. 26 is a sectional view of the liquid-crystal panel, taken along line B-B in FIG. 25.

In the present embodiment, since the display mode of the liquid-crystal panel 211 is changed to a VA mode as described above, the topology of the TFT 218, the pixel electrode 219, and the capacitance forming electrode 221 is also changed, which will be described below with reference to FIGS. 22 to 26, as appropriate. FIG. 22 is a circuit diagram illustrating the array of pixels PX in the liquid-crystal panel 211. FIG. 23 is an enlarged plan view of a portion in the vicinity of the TFTs 218 in the liquid-crystal panel 211. FIG. 24 is a sectional view of a portion in the vicinity of the TFT 216 in the liquid-crystal panel 211 (a sectional view along line A-A in FIG. 23). FIG. 25 is an enlarged plan view of a portion in the vicinity of the capacitance wire 220 in the liquid-crystal panel 211. FIG. 26 is a sectional view of a portion in the vicinity of a connection portion of the pixel electrode 219 and the capacitance forming electrode 221 in the liquid-crystal panel 211 (a sectional view along line B-B in FIG. 25).

As illustrated in FIGS. 22 to 24, each pixel electrode 219 according to the present embodiment is directly connected to a drain electrode 218C of the corresponding TFT 218. That is, in the present embodiment, the connection wires 22 (see FIGS. 5 and 7) described above in the first embodiment are omitted. More specifically, each pixel electrode 219 is disposed so as to overlap the drain electrode 218C of the corresponding TFT 218 and is also connected to the drain electrode 218C through a pixel-electrode contact hole CH7 provided in an interlayer insulating film 227 and a planarization film 229 that are interposed between the pixel electrode 219 and the drain electrode 218C. The slits 37 are not formed in a portion that is included in the pixel electrode 219 and the is connected to the drain electrode 218C. According to such a configuration, when an image signal that is supplied from a source wire 217 to a source electrode 218B of the TFT 218 is supplied to the drain electrode 218C via a channel portion 218D, the pixel electrode 219 connected to the drain electrode 218C is adapted to be charged to a potential based on the image signal. The drain electrode 218C of a first TFT 218α is directly connected to the first pixel electrode 219α, and the drain electrode 218C of a second TFT 218β is directly connected to the second pixel electrode 219β. In the present embodiment, since the connection wires 22 are omitted, each drain electrode 218C has a single layer structure including only a second metal film 226. This is because the necessity to ensure redundancy of the the drain electrode 218C is low in the present embodiment.

As illustrated in FIGS. 22, 25, and 26, the pixel electrode 219 is directly connected to the capacitance forming electrode 221. More specifically, an extension portion 219C of the pixel electrode 219 is disposed so as to overlap the capacitance forming electrode 221 and is connected to the capacitance forming electrode 221 through a capacitance-forming-electrode contact hole CH8 provided in the interlayer insulating film 227 and the planarization film 229 that are interposed between the extension portion 219C and the capacitance forming electrode 221. No slits 37 are formed in the extension portion 219C, which is a portion that is included in the pixel electrode 219 and that is connected to the capacitance forming electrode 221. According to such a configuration, when the pixel electrode 219 is charged to a potential based on the image signal in response to driving of the TFT 218, the capacitance forming electrode 221 connected to the pixel electrode 219 reaches a potential based on the image signal. Thus, an electrostatic capacitance is formed between the capacitance forming electrode 221 and the capacitance wire 220, so that the potential of the pixel electrode 219 is held. Since the first image signal is supplied to the capacitance forming electrode 221 via the pixel electrode 219, as described above, an aperture ratio associated with the pixel electrode 219 improves by an amount by which the connection wire 22 does not overlap the pixel electrode 219, compared with a case in which the connection wire 22 for transmitting image signals is provided separately from the pixel electrode 19, as in the first embodiment. Also, the first capacitance forming electrode 221α is directly connected to the first pixel electrode 219α, and the second capacitance forming electrode 221β is directly connected to the second pixel electrode 219β.

As described above, according to the present embodiment, the liquid-crystal display device 10 includes: a gate wire 216 that is disposed so as to be adjacent to the first pixel electrode 219α at an opposite side to the capacitance wire 220 and through which a scan signal is transmitted; a first source wire 217α that extends so as to intersect the gate wire 216 and through which the first image signal is transmitted; and the first TFT 218α that is disposed at an intersection position of the gate wire 216 and the first source wire 217α and that is connected to the first pixel electrode 219α, the gate wire 216, and the first source wire 217α, wherein the first TFT 218α has a gate electrode 218A connected to the gate wire 216, the source electrode 218B connected to the first source wire 217α, the channel portion 218D that has one end connected to the source electrode 218B and that is disposed so as to overlap the gate electrode 218A via a gate insulating film 224, and the drain electrode 218C that has one end connected to another end of the channel portion 218D and that has another end connected to the first pixel electrode 219α, and wherein the first capacitance forming electrode 221α is connected to the first pixel electrode 219α. With this arrangement, when a scan signal transmitted to the gate wire 216 is supplied to the gate electrode 218A of the first TFT 218α, the first TFT 218α is driven. In response, the first image signal transmitted to the first source wire 217α is supplied from the source electrode 218B to the drain electrode 218C via the channel portion 218D and is supplied to the first pixel electrode 219α connected to the drain electrode 218C, so that the first pixel electrode 219α is charged to a potential based on the first image signal, and the first image signal is supplied to the first capacitance forming electrode 221α. Thus, an electrostatic capacitance is formed between the first capacitance forming electrode 221α and the capacitance wire 220. Since the first image signal is supplied to the first capacitance forming electrode 221α via the first pixel electrode 219α, as described above, the aperture ratio associated with the first pixel electrode 219α improves, compared with a case in which a wire for transmitting the first image signal is provided separately from the first pixel electrode 219α.

Other Embodiments

The technology disclosed herein is not limited to the embodiments described above with reference to the drawings, and for example, embodiments as described below are also encompassed in the technical scope of the present disclosure.

(1) A specific formation range of the shield electrode 35, 135 in plan view can be changed as appropriate. For example, the shield electrode 35, 135 may be disposed to overlap the first capacitance forming electrode 21α, 121α, 221α and so as not to overlap the second capacitance forming electrode 21β, 221β. In addition, each shield electrode 35, 135 may be divided into a portion that overlaps the first capacitance forming electrode 21α, 121α, 221α and a portion that overlaps the second capacitance forming electrode 21β, 221β.

(2) In addition to (1), the formation range of the shield electrode 35, 135 may be a range that overlaps the entire area of the capacitance forming electrode 21, 221. The width dimension of most parts of the shield electrode 35, 135 may be smaller than or equivalent to the width dimension of the capacitance forming electrode 21, 221 or may be larger than or equivalent to the width dimension of the capacitance wire 20, 120, 220. The length dimension of the shield electrode 35, 135 may be smaller or larger than the length dimension of the first side portion 19A of the pixel electrode 19, 119, 219.

(3) The specific formation range of the second shield electrode 36 in plan view, the second shield electrode 36 being described in the second embodiment, can be changed as appropriate, as in the shield electrode 35, 135 described in (1) and (2).

(4) In a modification of the second embodiment, the second shield electrode 36 may be connected to the shield electrode 135, and the shield electrode 135 may be connected to the capacitance wire 120. In this case, the second shield electrode 36 is connected to the capacitance wire 120 via the shield electrode 135. Also, in this case, the connection position of the second shield electrode 36 and the shield electrode 135 and the connection position of the shield electrode 135 and the capacitance wire 120 may have a positional relationship that they do not overlap each other in plan view or may have a positional relationship that they overlap each other in plan view.

(5) In a modification of the third embodiment, the drain electrode 218C can be implemented by a laminated structure of the second metal film 226 and a third metal film.

(6) In a modification of the third embodiment, the liquid-crystal material included the liquid-crystal layer 211C may be a positive liquid-crystal material whose dielectric constant anisotropy is positive.

(7) Specific connection positions of the shield electrode 35, 135 and the second shield electrode 36 with respect to the capacitance wire 20, 120, 220 can be changed as appropriate.

(8) The capacitance forming electrode 21, 221 can be constituted by the third metal film 28, 128, and the shield electrode 35, 135 can be constituted by the second metal film 26, 226. In this case, the capacitance forming electrode 21, 221 is located in the same layer as the second source-wire constituent portion 17B of the source wire 17, 217, and the shield electrode 35, 135 is located in the same layer as the first source-wire constituent portion 17A of the source wire 17, 217.

(9) The shield electrode 35, 135 may be constituted by an electrically conductive film (e.g., a reduced-resistance region in the transparent electrode film 30, 130 or the semiconductor film 25) other than a film metal film. Although it is desirable that an oxide semiconductor be used for the semiconductor film 25 having a reduced-resistance region, the material thereof is not necessarily limited thereto.

(10) The structure of the source wire 17, 217 is not limited to a laminated structure or may be a single layer structure.

(11) When a single layer structure is used for the source wire 17, 217, as in (10) described above, for example, it is possible to implement a touch-panel function by using, the second metal film 26, 226 to constitute the source wire 17, 217 and by disposing a touch wire (a position detection wire), constituted by the third metal film 28, 128, at a position that overlaps the source wire 17, 217 in plan view. In such a case, a fringe-field switching (FFS) mode or the like is used as the display mode of the liquid-crystal panel 11, 111, 211, and the arrangement may be such that a common electrode that overlaps the pixel electrode 19, 119, 219 via an insulating film is provided on the array substrate 11A and is divided into a plurality of touch electrodes (position detection electrodes), and the touch wire is connected to the touch electrodes.

(12) When a single layer structure is used for the source wire 17, 217, as in (10) described above, for example, the source wire 17, 217 can be constituted by the second metal film 26, 226, and the capacitance wire 20, 120, 220 can be constituted by the third metal film 28, 128. In this case, the capacitance forming electrode 21, 221 and the shield electrode 35, 135 can be constituted by the second metal film 26, 226, and the other electrode can be constituted by the first metal film 23.

(13) The structure of the connection wire 22 is not limited to a laminated structure and may be a single layer structure.

(14) The structures of the source electrode 18B, 218B and the drain electrode 18C, 218C of the corresponding TFT 18, 218 are not limited to laminated structures and may be single layer structures.

(15) Each of the structures of the source wire 17, 217, the connection wire 22, and so on may be a laminated structure constituted by three or more metal films.

(16) Each of the structures of the source wire 17, 217, the connection wire 22, and so on may be a laminated structure of a metal film and an electrically conductive film (e.g., a reduced-resistance region in the transparent electrode film 30, 130 or the semiconductor film 25) other than a metal film.

(17) When the liquid-crystal display device 10 employs the field sequential system, time allocation may be performed so that the data writing period of each color differs from the display period of each color, other than performing time allocation so that the data writing period of each color and the display period of each color are equal to each other. For example, the red display period may be longer than the red-data writing period.

(18) The planarization film 29, 129, 229 may have a laminated structure of a layer made of organic material and a layer made of inorganic material. The layer made of the inorganic material is provided at an upper layer side or a lower layer side of the layer made of the organic material.

(19) The TFT 18, 218 may be an array in a matrix, other than a zigzag array.

(20) The plane shape of the pixel electrode 19, 119, 219 may be a vertically long rectangular shape or a horizontally long rectangular shape. In addition, the plane shape of the pixel electrodes 19, 119, and 219 may be a circular shape, an elliptical shape, or the like.

(21) The material of the semiconductor film 25 may be low-temperature polycrystalline silicon (LTPS).

(22) The display mode of the liquid-crystal panel 11, 111, 211 may be an FFS mode, an in-plane switching (IPS) mode, or the like.

(23) The liquid-crystal display device 10 may also be a non-see-through type device, other than a see-through type device.

(24) The liquid-crystal display device 10 may employ a color filter system, other than the field sequential system. In this case, the counter substrate 11B is provided with a color filter that exhibits red, green, and blue at a position that faces the pixel electrode 19, 119, 219, and a white light source that emits white light is used as a light source in the backlight device 12. With respect to the array of pixels PX in the color filter system, pixels PX that exhibit red, green, and blue may be disposed in a column or row direction. Alternatively, a pixel PX that exhibits white (no color) may be provided in addition to pixels PX that exhibit red, green, and blue, and these pixels PX may be arrayed in column and row directions, with two pixels PX in each thereof. In the latter case, the pixel electrode 19, 119, 219 can be made to have a square shape in plan view.

(25) The liquid-crystal panel 11, 111, 211 may be a reflective panel or a transflective panel, other than a transparent panel. In the case of the reflective panel, the backlight device 12 can be omitted.

(26) The display panel may be a type of display panel (e.g., an organic EL panel or a microcapsule-type electrophoresis display (EPD) panel) other than the liquid-crystal panel 11, 111, 211.

The present disclosure contains subject matter related to that disclosed in Japanese Priority Patent Application. JP 2020-069721 filed in the Japan Patent Office on Apr. 8, 2020, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:
   at least one capacitance wire;
   at least one first pixel electrode disposed so as to be adjacent to the capacitance wire;
   at least one second pixel electrode disposed so that the capacitance wire is located between the first pixel electrode and the second pixel electrode;
   a first capacitance forming electrode connected to the first pixel electrode and disposed so as to overlap the capacitance wire via an insulating film; and
   a shield electrode disposed so as to be located between the first pixel electrode and the second pixel electrode and so as to at least partially overlap the first capacitance forming electrode via an insulating film, wherein
   the shield electrode is disposed in a layer interposed between a first insulating film and a second insulating film, the first insulating film being stacked on the shield electrode and located between the shield electrode and the first and second pixel electrodes, and the second insulating film being located between the shield electrode and the first capacitance forming electrode, and
   wherein the first and second pixel electrodes are stacked on the first insulating film.

2. The display device according to claim 1, further comprising:
   a second capacitance forming electrode connected to the second pixel electrode and disposed so as to overlap the capacitance wire via an insulating film,
   wherein the first capacitance forming electrode and the second capacitance forming electrode are disposed so as to overlap the same capacitance wire via an insulating film, the capacitance wire being located between the first pixel electrode and the second pixel electrode to which the first capacitance forming electrode and the second capacitance forming electrode are respectively connected.

3. The display device according to claim 2,
   wherein the shield electrode is disposed so as to overlap both the first capacitance forming electrode and the second capacitance forming electrode via an insulating film, the first capacitance forming electrode and the second capacitance forming electrode being respectively connected to the first pixel electrode and the second pixel electrode that are disposed so that the capacitance wire is located therebetween.

4. The display device according to claim 3,
   wherein an end portion of the shield electrode, the end portion being adjacent to the second pixel electrode, extends more toward the second pixel electrode than an end portion of the first capacitance forming electrode, the end portion being adjacent to the second pixel electrode.

5. The display device according to claim 3,
   wherein an end portion of the shield electrode, the end portion being adjacent to the first pixel electrode, extends more toward the first pixel electrode than an end portion of the second capacitance forming electrode, the end portion being adjacent to the first pixel electrode.

6. The display device according to claim 1,
   wherein the shield electrode is disposed so as to overlap the capacitance wire via an insulating film and is connected to the capacitance wire through a contact hole provided in an insulating film interposed between the shield electrode and the capacitance wire.

7. The display device according to claim 1, further comprising:
   a plurality of image wires through which image signals are supplied to the first pixel electrode and the second pixel electrode,
   wherein each of the image wires has a first image-wire constituent portion and a second image-wire constituent portion that is disposed so as to overlap the first image-wire constituent portion via an insulating film and that is connected to the first image-wire constituent portion through a contact hole provided in the insulating film; and
   wherein the first capacitance forming electrode is constituted by a same electrically conductive film as a film that constitutes one of the first image-wire constituent portion and the second image-wire constituent portion, and the shield electrode is constituted by a same electrically conductive film as a film that constitutes the other of the first image-wire constituent portion and the second image-wire constituent portion.

8. The display device according to claim 1,
   wherein a plurality of sets, each including the capacitance wire, the first pixel electrode, and the second pixel electrode, are arrayed;
   wherein the display device comprises:
   first switching elements that are respectively connected to the first pixel electrodes,
   at least one first image wire that is connected to the first switching elements and through which first image signals are transmitted,
   second switching elements that are respectively connected to the second pixel electrodes,
   at least one second image wire that is connected to the second switching elements and through which second image signals are transmitted, and at least one scan wire that extends so as to intersect the first image wires and the second image wires and through which scan signals are transmitted; and
wherein two or more of the scan wires are disposed so as to be located between the first pixel electrode and the second pixel electrode that belong to different sets of the plurality of sets and that are adjacent to each other, the two or more scan wires being connected to both the first switching element and the second switching element that are respectively connected to the first pixel electrode and the second pixel electrode.

9. The display device according to claim 1, further comprising:
a scan wire that is disposed so as to be adjacent to the first pixel electrode at an opposite side to the capacitance wire and through which scan signals are transmitted;
a first image wire that extends so as to intersect the scan wire and through which first image signals are transmitted;
a first switching element that is disposed at an intersection position of the scan wire and the first image wire and that is connected to the first pixel electrode, the scan wire, and the first image wire,
wherein the first switching element has a first electrode connected to the scan wire, a second electrode connected to the first image wire, a channel portion that has one end connected to the second electrode and that is disposed so as to overlap the first electrode via an insulating film, and a third electrode connected to another end of the channel portion; and
a first connection wire that is connected to the third electrode, that extends toward the capacitance wire along the first image wire, and that is connected to the first capacitance forming electrode and the first pixel electrode at a position that overlaps the capacitance wire.

10. The display device according to claim 1,
wherein each of the first pixel electrode and the second pixel electrode has a first side portion that lies along the capacitance wire and a second side portion that intersects the first side portion and that has a length larger than or equal to a length of the first side portion.

11. The display device according to claim 1, further comprising:
a display panel having, at least, the capacitance wire, the first pixel electrode, the second pixel electrode, the first capacitance forming electrode, and the shield electrode;
a lighting device that supplies light for display on the display panel, the lighting device having a red light source that emits red light, a green light source that emits green light, and a blue light source that emits blue light;
a panel controller that controls the display panel so that at least a red-data writing period in which the first pixel electrode and the second pixel electrode are charged to have a red display gray scale, a green-data writing period in which the first pixel electrode and the second pixel electrode are charged to have a green display gray scale, and a blue-data writing period in which the first pixel electrode and the second pixel electrode are charged to have a blue display gray scale are included in one frame period as a plurality of data writing periods; and
a lighting controller that controls the lighting device so that the red light source is turned on, and the green light source and the blue light source are turned off in a red display period that is a period between the red-data writing period and the data writing period that is included in the plurality of data writing periods and that is not the red-data writing period, the green light source is turned on, and the red light source and the blue light source are turned off in a green display period that is a period between the green-data writing period and the data writing period that is included in the plurality of data writing periods and that is not the green-data writing period, and the blue light source is turned on, and the red light source and the green light source are turned off in a blue display period that is a period between the blue-data writing period and the data writing period that is included in the plurality of data writing periods and that is not the blue-data writing period.

12. A display device comprising:
at least one capacitance wire;
at least one first pixel electrode disposed so as to be adjacent to the capacitance wire;
at least one second pixel electrode disposed so that the capacitance wire is located between the first pixel electrode and the second pixel electrode;
a first capacitance forming electrode connected to the first pixel electrode and disposed so as to overlap the capacitance wire via an insulating film; and
a shield electrode disposed so as to be located between the first pixel electrode and the second pixel electrode and so as to at least partially overlap the first capacitance forming electrode via an insulating film,
wherein the shield electrode is disposed in a layer interposed between a first insulating film and a second insulating film, the first insulating film being located between the shield electrode and the second pixel electrode, and the second insulating film being located between the shield electrode and the first capacitance forming electrode; and
wherein the display device further comprises a second shield electrode that is constituted by a same electrically conductive film as a film that constitutes the second pixel electrode, that is disposed so as to overlap the shield electrode via the first insulating film, and that is connected to the shield electrode through a contact hole provided in the first insulating film.

13. The display device according to claim 12,
wherein the second shield electrode is connected to the capacitance wire through a contact hole provided in an insulating film interposed between the second shield electrode and the capacitance wire.

14. The display device according to claim 12, further comprising:
a display panel having, at least, the capacitance wire, the first pixel electrode, the second pixel electrode, the first capacitance forming electrode, and the shield electrode;
a lighting device that supplies light for display on the display panel, the lighting device having a red light source that emits red light, a green light source that emits green light, and a blue light source that emits blue light;
a panel controller that controls the display panel so that at least a red-data writing period in which the first pixel electrode and the second pixel electrode are charged to have a red display gray scale, a green-data writing period in which the first pixel electrode and the second pixel electrode are charged to have a green display gray scale, and a blue-data writing period in which the first pixel electrode and the second pixel electrode are charged to have a blue display gray scale are included in one frame period as a plurality of data writing periods; and a lighting controller that controls the lighting device so that the red light source is turned on, and the green light source and the blue light source are turned off in a red display period that is a period between the red-data writing period and the data writing period that is included in the plurality of data writing periods and that is not the red-data writing period, the green light source is turned on, and the red light source and the blue light source are turned off in a green display period that is a period between the green-data writing period and the data writing period that is included in the plurality of data writing periods and that is not the green-data writing period, and the blue light source is turned on, and the red light source and the green light source are turned off in a blue display period that is a period between the blue-data writing period and the data writing period that is included in the plurality of data writing periods and that is not the blue-data writing period.

15. A display device comprising:

at least one capacitance wire;

at least one first pixel electrode disposed so as to be adjacent to the capacitance wire;

at least one second pixel electrode disposed so that the capacitance wire is located between the first pixel electrode and the second pixel electrode;

a first capacitance forming electrode connected to the first pixel electrode and disposed so as to overlap the capacitance wire via an insulating film; and a shield electrode disposed so as to be located between the first pixel electrode and the second pixel electrode and so as to at least partially overlap the first capacitance forming electrode via an insulating film;

a scan wire that is disposed so as to be adjacent to the first pixel electrode at an opposite side to the capacitance wire and through which scan signals are transmitted;

first image wires that extend so as to intersect the scan wires and through which first image signals are transmitted; and a first switching element that is disposed at an intersection position of the scan wire and the first image wire and that is connected to the first pixel electrode, the scan wire, and the first image wire, wherein the first switching element has a first electrode connected to the scan wire, a second electrode connected to the first image wire, a channel portion that has one end connected to the second electrode and that is disposed so as to overlap the first electrode via an insulating film, and a third electrode that has one end connected to another end of the channel portion and that has another end connected to the first pixel electrode, and wherein the first capacitance forming electrode is connected to the first pixel electrode.

16. The display device according to claim 15, further comprising:

a display panel having, at least, the capacitance wire, the first pixel electrode, the second pixel electrode, the first capacitance forming electrode, and the shield electrode;

a lighting device that supplies light for display on the display panel, the lighting device having a red light source that emits red light, a green light source that emits green light, and a blue light source that emits blue light;

a panel controller that controls the display panel so that at least a red-data writing period in which the first pixel electrode and the second pixel electrode are charged to have a red display gray scale, a green-data writing period in which the first pixel electrode and the second pixel electrode are charged to have a green display gray scale, and a blue-data writing period in which the first pixel electrode and the second pixel electrode are charged to have a blue display gray scale are included in one frame period as a plurality of data writing periods; and a lighting controller that controls the lighting device so that the red light source is turned on, and the green light source and the blue light source are turned off in a red display period that is a period between the red-data writing period and the data writing period that is included in the plurality of data writing periods and that is not the red-data writing period, the green light source is turned on, and the red light source and the blue light source are turned off in a green display period that is a period between the green-data writing period and the data writing period that is included in the plurality of data writing periods and that is not the green-data writing period, and the blue light source is turned on, and the red light source and the green light source are turned off in a blue display period that is a period between the blue-data writing period and the data writing period that is included in the plurality of data writing periods and that is not the blue-data writing period.

* * * * *